(12) United States Patent
Seki

(10) Patent No.: US 7,096,403 B2
(45) Date of Patent: Aug. 22, 2006

(54) ITERATIVE CONCATENATED CODE DECODING CIRCUIT AND ENCODING/DECODING SYSTEM USING THE SAME

(75) Inventor: Katutoshi Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 501 days.

(21) Appl. No.: 10/322,457

(22) Filed: Dec. 19, 2002

(65) Prior Publication Data

US 2003/0126549 A1 Jul. 3, 2003

(30) Foreign Application Priority Data

Dec. 19, 2001 (JP) ............................. 2001-385426

(51) Int. Cl.
*H03M 13/00* (2006.01)
(52) U.S. Cl. ...................................... 714/755; 714/784
(58) Field of Classification Search ................ 714/786, 714/755, 784
See application file for complete search history.

(56) References Cited

U.S. PATENT DOCUMENTS

| | | | | |
|---|---|---|---|---|
| 5,181,209 A | * | 1/1993 | Hagenauer et al. | ......... 714/795 |
| 5,206,864 A | * | 4/1993 | McConnell | ................. 714/755 |
| 5,311,522 A | * | 5/1994 | Murakami | ................... 714/755 |
| 5,412,620 A | * | 5/1995 | Cafarella et al. | ........... 367/134 |
| 5,432,613 A | * | 7/1995 | Lee | ........................... 386/112 |
| 5,583,707 A | * | 12/1996 | Seki | ........................... 360/48 |
| 5,631,914 A | | 5/1997 | Kashida et al. | |
| 6,516,438 B1 | * | 2/2003 | Wilcoxson et al. | ......... 714/755 |
| 6,598,203 B1 | * | 7/2003 | Tang | .......................... 714/790 |
| 6,622,277 B1 | * | 9/2003 | Ramanujam et al. | ....... 714/755 |
| 6,658,605 B1 | * | 12/2003 | Yoshida et al. | ............. 714/702 |
| 6,769,089 B1 | * | 7/2004 | Gupta | ........................ 714/786 |

FOREIGN PATENT DOCUMENTS

| | | |
|---|---|---|
| CN | 1290428 A | 4/2001 |
| CN | 1295382 A | 5/2001 |
| EP | 1 324 501 A1 | 7/2003 |
| JP | 6-303151 | 10/1994 |
| JP | 10-135845 | 5/1998 |
| JP | 2001-136079 | 5/2001 |
| JP | 2001-160761 | 6/2001 |

OTHER PUBLICATIONS

European Search Report dated Sep. 24, 2004.
M. Anwarul Hasan, et al., "Algorithms and Architectures for the Design of a VLSI Reed-Solomon Codec", Chapter 5 from the book, Wicker ed., 1994, XP2055402, pp. 60-107.

(Continued)

*Primary Examiner*—Albert DeCady
*Assistant Examiner*—Mujtaba K. Chaudry
(74) *Attorney, Agent, or Firm*—McGinn IP Law Group, PLLC

(57) ABSTRACT

This invention provides an iterative concatenated code decoding circuit that allows a circuit size to be reduced and the error correction capability to be improved. A encoded data received through a transmission path from a first stage inner decoder is decoded, in which the decoded data is output to a first stage deinterleaver, and a first stage inner code syndrome coefficient corresponding to the decoded data is output to a second stage inner decoder. A first stage deinterleaver makes the deinterleaving of the decoded data, and outputs the deinterleaved data to a first stage outer decoder. The first stage outer decoder decodes the deinterleaved data and outputs the decoded data to a first stage interleaver, in which the first stage inner code modification syndrome coefficient is derived and output to a second stage inner decoder. The first stage interleaver makes the interleaving of the decoded data, and outputs the interleaved data to the second stage inner decoder.

18 Claims, 14 Drawing Sheets

OTHER PUBLICATIONS

T. Mizuochi, et al., "Transparent Multiplexer Featuring Super FEC for Optical Transport Networking", SubOptic 2001, p. 4.2.3, pp. 484-487, 2001.

Omar AIT SAB, "FEC Contribution in Submarine Transmission Systems", SubOptic 2001, p. 4.2.6, pp. 496-499, 2001.

European Search Report dated Apr. 23, 2003.

O. Ait Sab, "FEC Contribution in Submarine Transmission Systems", Suboptic 2001, May 2001, pp. 496-499, XP001151605.

F.J. Macwilliams, et al., "The Theory of Error-Correcting Codes Part I", 1977, North-Holland, Amsterdam, XP002237954.

T. Mizuochi, et al., "Transparent Multiplexer featuring Super FEC for Optical Transport Networking", Suboptic 2001, May 2001, pp. 484-487, XP001151604.

Japanese Office Action dated Sep. 24, 2004 with Partial English Translation.

Chinese Office Action dated Apr. 1, 2005 with English Translation.

T. Mizuochi, et al., "Transparent Multiplexer Featuring Super FEC for Optical Transport Networking", SubOptic 2001, p. 4.2.3, pp. 484-487, 2001.

Omar AIT SAB, "FEC Contribution in Submarine Transmission Systems", SubOptic 2001, p. 4.2.6, pp. 496-499, 2001.

H. Okano, "A Construction Method of High-Speed Decoders Using ROM's for Bose-Chaudhuri-Hocquengham and Reed-Solomon Codes", IEEE Transactions on Computers, vol. C-36, No. 10, Oct. 1987, pp. 1164-1171 and 480-487.

Hideki Imai, "Coding Theory", The Telecommunications Association, pp. 169-172, Mar. 15, 1990.

* cited by examiner

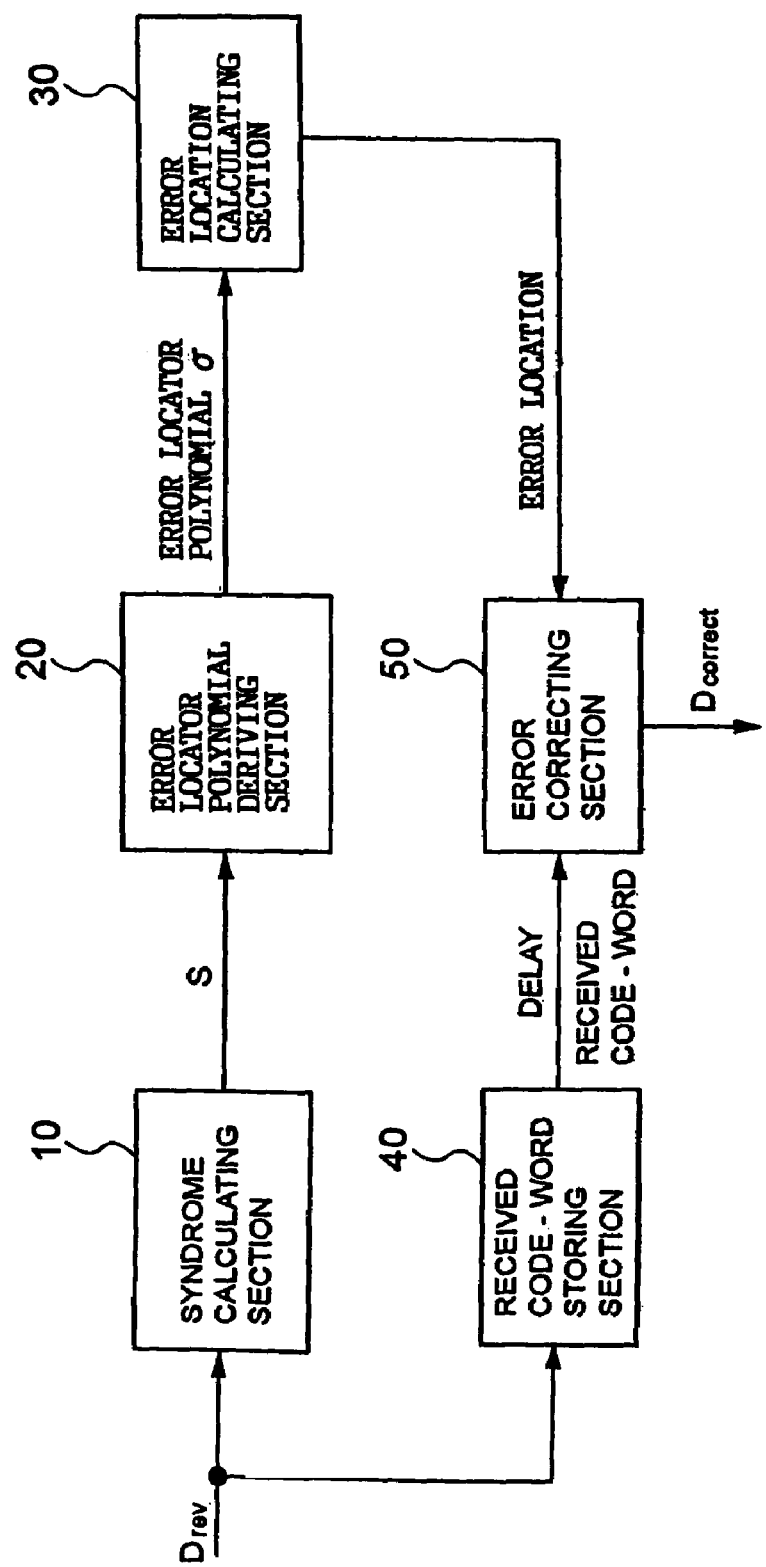

ITERATIVE CONCATENATED CODE DECODING CIRCUIT AND ENCODING/DECODING SYSTEM USING THE SAME

BACKGROUND OF THE INVENTION

1. Field of the Invention

The present invention relates to an iterative concatenated code decoding circuit and an encoding/decoding system using the circuit. And more particularly relates to an iterative concatenated BCH (Bose-Chaudhuri-Hocquenghem) decoding circuit, in which two codes called the inner and outer code are concatenated.

2. Description of the Prior Art

The concatenated BCH (Bose-Chaudhuri-Hocquenghem) decoding circuit can improve the error correction capability by applying iterative decoding scheme, as shown in FIG. 12.

In FIG. 12, the input data $D_{in}$ is firstly encoded by an outer encoder 100. The encoded data $D_{enc-outer}$ is interleaved by an interleaver 200, and then encoded by an inner encoder 300. The encoded data $D_{enc-inner}$ output from the inner encoder 300 is output to a transmission path 400.

The encoded data $D_{rev}$ with the errors added through the transmission path 400 is decoded by an inner decoder 500, and the errors are corrected. The decoded data $D_{dec-inner}$ is deinterleaved by a deinterleaver 600, and then decoded by an outer decoder 700, and the errors that are not corrected by the inner decoder 500 are corrected.

FIG. 13 is a block diagram showing the configuration of the conventional N-times iterative concatenated BCH decoder. The encoded data $D_{rev}$ received through the transmission path, not shown, is decoded by a first stage inner decoder 500-1. The decoded data $D_{inner-1}$ is deinterleaved by a first stage deinterleaver 600-1, and then decoded by a first stage outer decoder 700-1. The decoded data $D_{outer-1}$ is interleaved again by a first stage interleaver 200-1, and then decoded by a second stage inner decoder 500-2.

The decoded data $D_{inner-2}$ is deinterleaved again by a second stage deinterleaver 600-2, and then decoded by a second stage outer decoder 700-2. The decoded data $D_{outer-2}$ is interleaved again by a second stage interleaver 200-2. The above operation is iterated by N times to correct the transmission errors gradually.

FIG. 14 shows the configuration of the conventional BCH decoder. The BCH decoder comprises a syndrome calculating section 10, an error locator polynomial deriving section 20, an error location calculating section 30, a received code-word storing section 40, and an error correcting section 50.

To explain BCH decoding principle, BCH(255, 215) code is considered as an example. This code has 5 bits error correction capability per one code-word.

The syndrome calculating section 10 calculates the coefficients $S_i$ for a syndrome polynomial $S(z)$ that is defined by the expression, $$S(z) = S_1 z + S_2 z^2 + \ldots + S_{10} z^{10} \qquad (1)$$

The syndrome coefficients $S_i$ are defined by the expression, $$S_i = Y(\alpha^i) \qquad (2)$$
$$= Y_0 + Y_1 \alpha^i + Y_2 \alpha^{2i} + Y_3 \alpha^{3i} + \ldots + Y_{254} \alpha^{254i}$$
$$i = 1, \ldots, 5$$

where $Y(x)$ is a received polynomial and $\alpha$ is a primitive element.

Each coefficient of the received polynomial $Y(x)$ corresponds to each bit of the encoded data $D_{rev}$ received through the transmission path. If the received polynomial $Y(x)$ contains no error, the syndrome coefficients become all zero.

The error locator polynomial deriving section 20 derives an error locator polynomial $\sigma(z)$, employing the Euclid's algorithm, and outputs it to the error location calculating section 30. The error locator polynomial $\sigma(z)$ is represented by the expression, $$\sigma(z) = \sigma_0 + \sigma_1 z + \ldots + \sigma_5 z^5 \qquad (3)$$

The error location calculating section 30 calculates an error location from the error locator polynomial.

The Chien search algorithm, which evaluates the error locator polynomial $\sigma(z)$ at all field elements of GF(256) can be used to find error locations and values. If $\sigma(\alpha^i)$ is a root of error locator polynomial $\sigma(z)$, the power of the root indicates the error locations of the received code polynomial $Y(x)$.

The error correcting section 50 corrects the received code-word stored in the received code-word storing section 40 on the basis of an error location input from the error location calculating section 30 and outputs the corrected code-word to the outside.

In the related-art techniques, the BCH code having the comparable coding ratio for the inner code and the outer code is employed. This BCH code was described in T. Mizuochi et al., "Transparent multiplexer featuring super FEC for optical Transport networking" (SubOptic 2001, P4.2.3, 2001) and Omar AIT SAB, "FEC contribution in submarine transmission systems" (SubOptic 2001, P4.2.6, 2001).

In the conventional iterative concatenated BCH decoding circuit as described above, if an average error number of the received code-word is greater than or equal to the number of correctable bits, the errors are hardly corrected with the BCH code. Since the outer decoder has a coding ratio comparable to that of the inner decoder, the outer decoder can hardly correct the errors when the inner decoder can hardly correct the errors.

Moreover, in the conventional iterative concatenated BCH decoder, the outer decoder and the inner decoder having the comparable coding ratio must be made the same circuit configuration, resulting in a problem that the circuit size becomes large. In particular, the circuit size is increased owing to the Euclid's algorithm or the Chien search algorithm.

SUMMARY OF THE INVENTION

In order to solve the above-mentioned problem, the present invention provides an iterative concatenated code decoding circuit that has a reduced circuit size and the improved error correction capability, and an encoding/decoding system employing the same circuit.

An iterative concatenated code decoding circuit of the invention decodes a concatenated code which utilizes the inner code with a high coding ratio, and an outer code with a low coding ratio, where coding ratio is represented by (code-word length–redundancy check length)/(code-word length).

Another iterative concatenated code decoding circuit of the invention comprises an inner decoder for decoding the encoded data received through a transmission path and correcting an error of the data, a deinterleaver for deinterleaving the data decoded by the inner decoder, an outer decoder for decoding the deinterleaved data and correcting an error of the data, and an interleaver for interleaving the data decoded by the outer decoder, in which the inner decoder, the deinterleaver, the outer decoder and the interleaver are disposed at N (N is a positive integer) stages. The iterative concatenated code decoding circuit employing a concatenated code concatenating two codes of an outer code and an inner code. The inner decoder decodes the inner code with a high coding ratio, and the outer decoder decodes the outer code with a low coding ratio.

An encoding/decoding system of the invention comprises an encoding device for encoding a concatenated code concatenating two codes of an outer code and an inner code, and a decoding device including an iterative concatenated code decoding circuit for decoding the concatenated code. The encoding device comprises an inner encoder for encoding the inner code with a high coding ratio, and an outer encoder for encoding the outer code with a low coding ratio, and the iterative concatenated code decoding circuit comprises an inner decoder for decoding the inner code with the high coding ratio, and an outer decoder for decoding the outer code with the low coding ratio.

Another encoding/decoding system of the invention comprises an encoding device for encoding a concatenated code concatenating two codes of an outer code and an inner code, and an inner decoder for decoding the encoded data received through a transmission path from the encoding device and correcting the errors of the data, a deinterleaver for deinterleaving the decoded data, an outer decoder for decoding the deinterleaved data and correcting the errors of the data, and an interleaver for interleaving the data decoded by the outer decoder, in which the inner decoder, the deinterleaver, the outer decoder and the interleaver are disposed at N (N is a positive integer) stages. The iterative concatenated code decoding circuit employing the concatenated code concatenating two different outer code and inner code. The encoding device has an inner encoder for encoding the inner code with a high coding ratio, and an outer encoder for encoding the outer code with a low coding ratio, and the inner decoder decodes the inner code with the high coding ratio, and the outer decoder decodes the outer code with the low coding ratio.

That is, the iterative concatenated code decoding circuit of the invention employs the inner code having a high coding ratio and the outer code having a low coding ratio, thereby reducing the circuit size and improving error correction capability.

The inner decoder for the iterative concatenated code decoding circuit of the invention has a higher coding ratio, or higher error correction capability, than the inner decoder of conventional concatenated code, which has the equal coding ratio of the concatenated code. The coding ratio of the concatenated code is indicated as the concatenated coding ratio here in after.

Hence, the inner decoder of the invention can correct the errors at such a bad input error rate as the inner decoder of the conventional technique can hardly correct errors. The outer decoder corrects only remaining errors that are not corrected by the inner decoder, whereby there is no problem even if the outer decoder of the invention has a low error correction capability or a low coding ratio.

Since the outer decoder of the invention has a low coding ratio, the error location can be directly obtained from the syndrome coefficients, employing the ROM (Read Only Memory).

In this case, the outer decoder of the invention has no need for the error locator polynomial deriving section with the Euclid's algorithm and the error location calculating section with the Chien search algorithm. On the other hand, both of them were required for each of the inner decoder and the outer decoder by the conventional technique, resulting in a reduced circuit size.

Therefore, this invention can provide the iterative concatenated code decoding circuit having the reduced circuit size and the improved error correction capability as compared with the conventional techniques.

A first feature of the invention is that the error location and the inner code modification syndrome coefficient are obtained by the outer decoder having a low coding ratio, using the ROM. In this case, the outer decoder of the invention has no need for the error locator polynomial deriving section with the Euclid's algorithm and the error location calculating section with the Chien search algorithm, both of which were required for the outer decoder by the conventional technique, resulting in a reduced circuit size.

A second feature of the invention is that the inner decoders at the second and ensuing stages decode on the basis of the result of adding the syndrome coefficient S of the inner decoder at the former stage and the inner code modification syndrome coefficient SR calculated by the outer decoder at the former stage. In this case, there is no need of acquiring the syndrome coefficient from the received polynomial, unlike the conventional technique, whereby the inner decoders at the second and ensuing stages of the invention have the reduced circuit size.

A third feature of the invention is that the inner code having a high coding ratio and the outer code having a low coding ratio are employed to realize the high error correcting capability. If an average error number of the received code-word is greater than the number of correctable bits, BCH decoder can hardly correct the errors. The inner decoder for the iterative concatenated code decoding circuit of the invention has a higher coding ratio, or more correctable bits, than the inner decoder having the comparable concatenated coding ratio by the conventional technique.

Hence, the inner decoder of the invention can correct the errors at such a bad input error rate as the inner decoder of the conventional technique can hardly correct errors. The outer decoder of the invention corrects only remaining errors that are not corrected by the inner decoder, whereby there is no problem even if low error correction capability.

On one hand, since the outer decoder of the conventional technique has an almost equivalent coding ratio to the inner decoder, if the errors are hardly corrected by the inner decoder, the errors are hardly corrected by the outer decoder.

The iterative concatenated code decoding circuit of the invention will be described below, exemplifying the two-dimensional BCH code. For example, the N-times iterative concatenated BCH decoding circuit is employed in which the depth of interleaving/deinterleaving is L, the code length of the inner code is $C_{inner}$ bits, the Galois field primitive polynomial order of the inner code is $M_{inner}$, the number of correctable bits per code-word of the inner code is $T_{inner}$, the code length of the outer code is $C_{outer}$ bits, the Galois field primitive polynomial order of the outer code is $M_{outer}$, the number of correctable bits per code-word of the outer code is $T_{outer}$, and the iterative number is N.

In this case, assuming that the coding ratio of the inner code is $RA_{inner}$ and the coding ratio of the outer code is $RA_{outer}$, the coding ratio RA of the concatenated code is represented by the expression, $$RA_{inner} = C_{inner}/[C_{inner} - (T_{inner} \times M_{inner})] \quad (4)$$

$$RA_{outer} = C_{outer}/[C_{outer} - (T_{outer} \times M_{outer})] \quad (5)$$

$$RA = RA_{inner} \times RA_{outer} = \{C_{inner}/[C_{inner} - (T_{inner} \times M_{inner})]\} \times \{C_{outer}/[C_{outer} - (T_{outer} \times M_{outer})]\} \quad (6)$$

The iterative concatenated BCH decoding circuit as above described employs the inner code having a high coding ratio $RA_{inner}$ and the outer code having a low coding ratio $RA_{outer}$ to reduce the circuit size and improve the error correction capability.

As is the case with the outer decoder of this invention, if the coding ratio $RA_{outer}$ is low (or the number of correctable bits is small), the error location can be directly obtained from the syndrome coefficients, employing the ROM. This respect of employing the ROM to obtain the error location is described in H. Okano, "A Construction Method of High-Speed Decoders Using ROMS's for Bose-Chaudhuri-Hocquenghem and Reed-Solomon Codes" (IEEE trans. Comput., vol. C-6, No. 10, October 1987).

BRIEF DESCRIPTION OF THE DRAWINGS

FIG. 14 is the configuration of the conventional BCH decoder.

DESCRIPTION OF THE PREFERRED EMBODIMENTS

Figure 1:
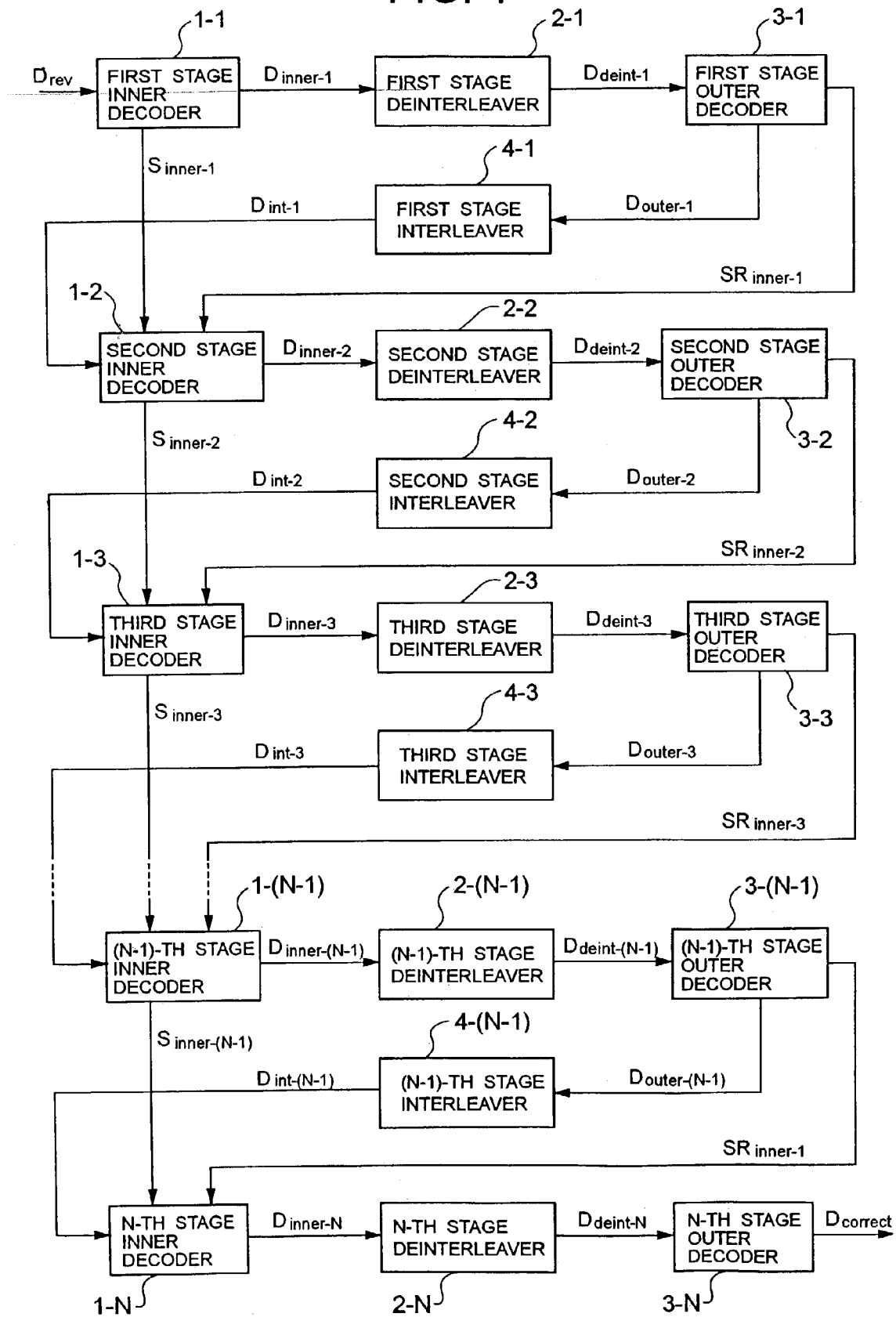
FIG. 1 is a block diagram showing a configuration of an iterative concatenated BCH decoding circuit according to an embodiment of the present invention.

The preferred embodiments of the present invention will be described below with reference to the accompanying drawings. FIG. 1 is a block diagram showing a configuration of an iterative concatenated BCH decoding circuit according to an embodiment of the present invention. The iterative concatenated BCH decoding circuit according to this embodiment of the invention comprises the first stage to N-th stage inner decoders 1-1 to 1-N, the first stage to N-th stage deinterleavers 2-1 to 2-N, the first stage to N-th stage outer decoders 3-1 to 3-N, and the first stage to (N−1)-th stage interleavers 4-1 to 4-(N−1).

The coding ratio in the iterative concatenated BCH decoding circuit according to this embodiment of the invention is represented by $RA_{inner} \times RA_{outer}$ (coding ratio of concatenated code is RA), where $RA_{inner}$ is the coding ratio of the inner code and $RA_{outer}$ is the coding ratio of the outer code.

The first stage to N-th stage outer decoders 3-1 to 3-N directly calculate the error location from the syndrome coefficients, using the ROM, whereby the error locator polynomial deriving section with the Euclid's algorithm and the error location calculating section with the Chien search algorithm can be dispensed with.

When the outer decoder corrects the errors, the syndrome coefficient for the output data of the inner decoder at the former stage and the syndrome coefficient for the input data of the inner decoder at the latter stage are changed. A variation in the syndrome coefficient is called an inner code modification syndrome coefficient SR.

The inner code modification syndrome coefficient SR can be derived from the error location detected by the outer decoder. The first stage to (N−1)-th stage outer decoders 3-1 to 3-(N−1) obtain the inner code modification syndrome coefficient SR for the next stage directly from the syndrome coefficient of the outer decoder, using the ROM.

Each of the second to N-th stage inner decoders 1-2 to 1-N at the second and ensuing stages calculates the syndrome coefficient corresponding to the input data of the inner decoder by adding the syndrome coefficient corresponding to the output data of the inner decoder at the former stage and the syndrome coefficient SR calculated by the outer decoder at the former stage. In this case, it is unnecessary to calculate the syndrome coefficient from the input data, unlike the related-art technique, whereby the circuit configuration of the inner decoders at the second and ensuing stages can be reduced.

Subsequently, the operation of the iterative concatenated BCH decoding circuit will be described below. First of all, at a first stage, the first stage inner decoder 1-1 decodes the encoded data $D_{rev}$ received through the transmission path, and outputs the decoded data $D_{inner-1}$ to the first stage deinterleaver. Also, the first stage inner decoder 1-1 outputs the first stage inner code syndrome coefficient $S_{inner-1}$ corresponding to the decoded data $D_{inner-1}$ to the second stage inner decoder 1-2.

The first deinterleaver 2-1 deinterleaves the decoded data $D_{inner-1}$, and outputs the deinterleaved data $D_{deint-1}$ to the first stage outer decoder 3-1. The first stage outer decoder 3-1 decodes the deinterleaved data $D_{deint-1}$ and outputs the decoded data $D_{outer-1}$ to the first stage interleaver 4-1. Also, first stage outerdecoder 3-1 derives the first stage inner code modification syndrome coefficient $SR_{inner-1}$, and outputs it to the second stage inner decoder 1-2. The first interleaver 4-1 interleaves the decoded data $D_{outer-1}$, and outputs the interleaved data $D_{int-1}$ to the second stage inner decoder 1-2.

At the second stage, the second stage inner decoder 1-2 decodes the interleaved data $D_{int-1}$ on the basis of the first stage inner code syndrome coefficient $S_{inner-1}$ and the first stage inner code modification syndrome coefficient $SR_{inner-1}$, and outputs the decoded data $D_{inner-2}$ to the second stage deinterleaver 2-2. Also, the second stage inner decoder 1-2 outputs the second stage inner code syndrome coefficient $S_{inner-2}$ corresponding to the decoded data $D_{inner-2}$ to the third stage inner decoder 1-3.

The second stage deinterleaver 2-2 deinterleaves the decoded data $D_{inner-2}$, and outputs the deinterleaved data $D_{deint-2}$ to the second stage outer decoder 3-2. The second stage outer decoder 3-2 decodes the deinterleaved data $D_{deint-2}$ and outputs the decoded data $D_{outer-2}$ to the second stage interleaver 4-2. Also, the second stage outer decoder 3-2 derives the second stage inner code modification syndrome coefficient $SR_{inner-2}$, and outputs it to the third stage inner decoder 1-3. The second stage interleaver 4-2 interleaves the decoded data $D_{outer-2}$, and outputs the interleaved data $D_{int-2}$ to the third stage inner decoder 1-3.

Each of the circuits at the third stage to (N–1)-th stage performs the same processing as each circuit at the second stage.

At the final stage, the N-th stage inner decoder 1-N decodes the interleaved data $D_{int-(N-1)}$ on the basis of the (N–1)-th stage inner code syndrome coefficient $S_{inner-(N-1)}$ and the (N–1)-th stage inner code modification syndrome coefficient $SR_{inner-(N-1)}$, and outputs the decoded data $D_{inner-N}$ to the N-th stage deinterleaver 2-N. Also, the N-th stage deinterleaver 2-N deinterleaves the decoded data $D_{inner-N}$, and outputs the deinterleaved data $D_{deint-N}$ to the N-th stage outer decoder 3-N. The N-th stage outer decoder 3-N decodes the deinterleaved data $D_{deint-N}$ and outputs the concatenated code decoded data $D_{correct}$.

Figure 2:
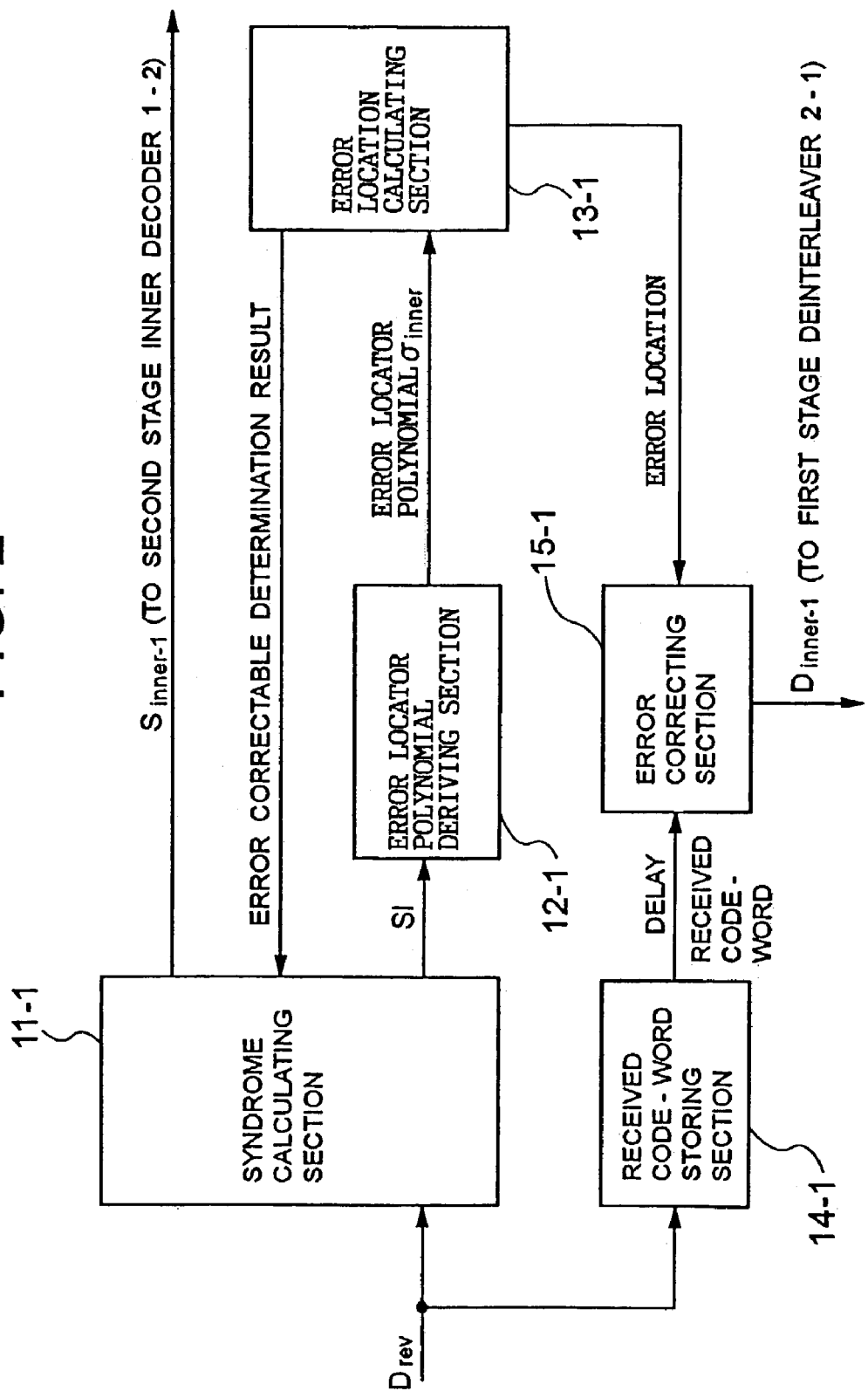
FIG. 2 is a block diagram showing a configuration of a first stage inner decoder of FIG. 1.

FIG. 2 is a block diagram showing a configuration of the first stage inner decoder 1-1 of FIG. 1. In FIG. 2, the first stage inner decoder 1-1 comprises a syndrome calculating section 11-1, an error locator polynomial deriving section 12-1, an error location calculating section 13-1, a received code-word storing section 14-1, and an error correcting section 15-1.

The syndrome calculating section 11-1 calculates the coefficients $SI_i$ (i=1, ..., 2*$T_{inner}$) for a syndrome polynomial SI(z) that is defined by the expression, $$SI(z) = SI_1 z + SI_2 z^2 + \ldots + SI_j z^j$$

$$j = 2 * T_{inner} \quad (7)$$

The syndrome coefficients $SI_i$ are defined by the expression, $$SI_i = Y_{inner}(\alpha^i) \quad (8)$$
$$= Y_0 + Y_1(\alpha_{inner})^i + Y_2(\alpha_{inner})^{2i} + \ldots + Y_k(\alpha_{inner})^{ki}$$
$$i = 1, \ldots, 2 * T_{inner}$$
$$k = C_{inner} - 1$$

where $Y_{inner}(x)$ is a received polynomial and $\alpha_{inner}$ is a primitive element for the Galois field.

Each coefficient of the received polynomial $Y_{inner}(x)$ corresponds to each bit of the encoded data $D_{rev}$ received through the transmission path. The syndrome coefficient $SI_i$ is an element in the Galois field and is represented by the width of $M_{inner}$ bits. If the encoded data $D_{rev}$ received through the transmission path contains no error, the syndrome coefficients become all zero. The calculated syndrome coefficient $SI_i$ is output to the error locator polynomial deriving section 12-1.

Also, the syndrome calculating section 11-1 outputs the syndrome coefficient for the decoded data $D_{inner-1}$ by the first stage inner decoder 1-1 as the first stage inner code syndrome coefficient $S_{inner-1,i}$ (i=1, ..., 2*$T_{inner}$) to the second stage inner decoder 1-2. If the errors in the received polynomial $Y_{inner}(x)$ are less than or equal to an error correctable bit number, the errors are all corrected, and zero is output as the first stage inner code syndrome coefficient $S_{inner-1,i}$. If the errors in the received polynomial $Y_{inner}(x)$ are more than an error correctable bit number, the errors are not corrected, and the encoded data $D_{rev}$ received through the transmission path is directly output as the decoded data $D_{inner-1}$, whereby the syndrome coefficient $SI_i$ derived by the syndrome calculating section 11-1 is output as the first stage inner code syndrome coefficient $S_{inner-1,i}$. The error location calculating section 13-1 determines whether or not the errors are correctable, and the determination result is input into the syndrome calculating section 11-1.

The error locator polynomial deriving section 12-1 derives an error locator polynomial $\sigma_{inner}(z)$, employing the Euclid's algorithm on the basis of the syndrome coefficients $SI_i$ (i=1, ..., 2*$T_{inner}$), and outputs it to the error location calculating section 13-1. The error locator polynomial $\sigma_{inner}(z)$ is represented by the expression, $$\sigma_{inner}(z) = \sigma_0 + \sigma_1 z + \ldots + \sigma_h z^h$$

$$h = T_{inner} \quad (9)$$

For the Euclid's algorithm, refer to "Coding Theory" (by Hideki Imai, The Telecommunications Association, P.169–172, Mar. 15, 1990).

The error location calculating section 13-1 derives an error location from the error locator polynomial $\sigma_{inner}(z)$, and outputs it to the error correcting section 15-1. Substituting successively $\alpha_{inner}$ to the i-th power or $(\alpha_{inner})^i$ (i=1, ..., $C_{inner}$) into the error locator polynomial $\sigma_{inner}(z)$, if $\sigma_{inner}[(\alpha_{inner})^i]$ is equal to 0, the errors have occurred in received code-word of the $C_{inner}$-i-th order component. In this manner, a method for solving the error locator polynomial by substituting $\alpha_{inner}$ to the i-th power or $(\alpha_{inner})^i$ successively is called a Chien search algorithm. If the number of errors obtained by the Chien search algorithm is not matched with the order of the error locator polynomial $\sigma_{inner}(z)$, the errors are determined to be uncorrectable. This error correctable determination result is output to the syndrome calculating section 11-1. A theoretical background for deriving the error location from the error locator polynomial is described in the above "Coding Theory".

The error correcting section 15-1 corrects the received code-word stored in the received code-word storing section 14-1 on the basis of the error location input from the error location calculating section 13-1, and outputs the decoded data $D_{inner-1}$ to the first stage deinterleaver 2-1.

Figure 3:
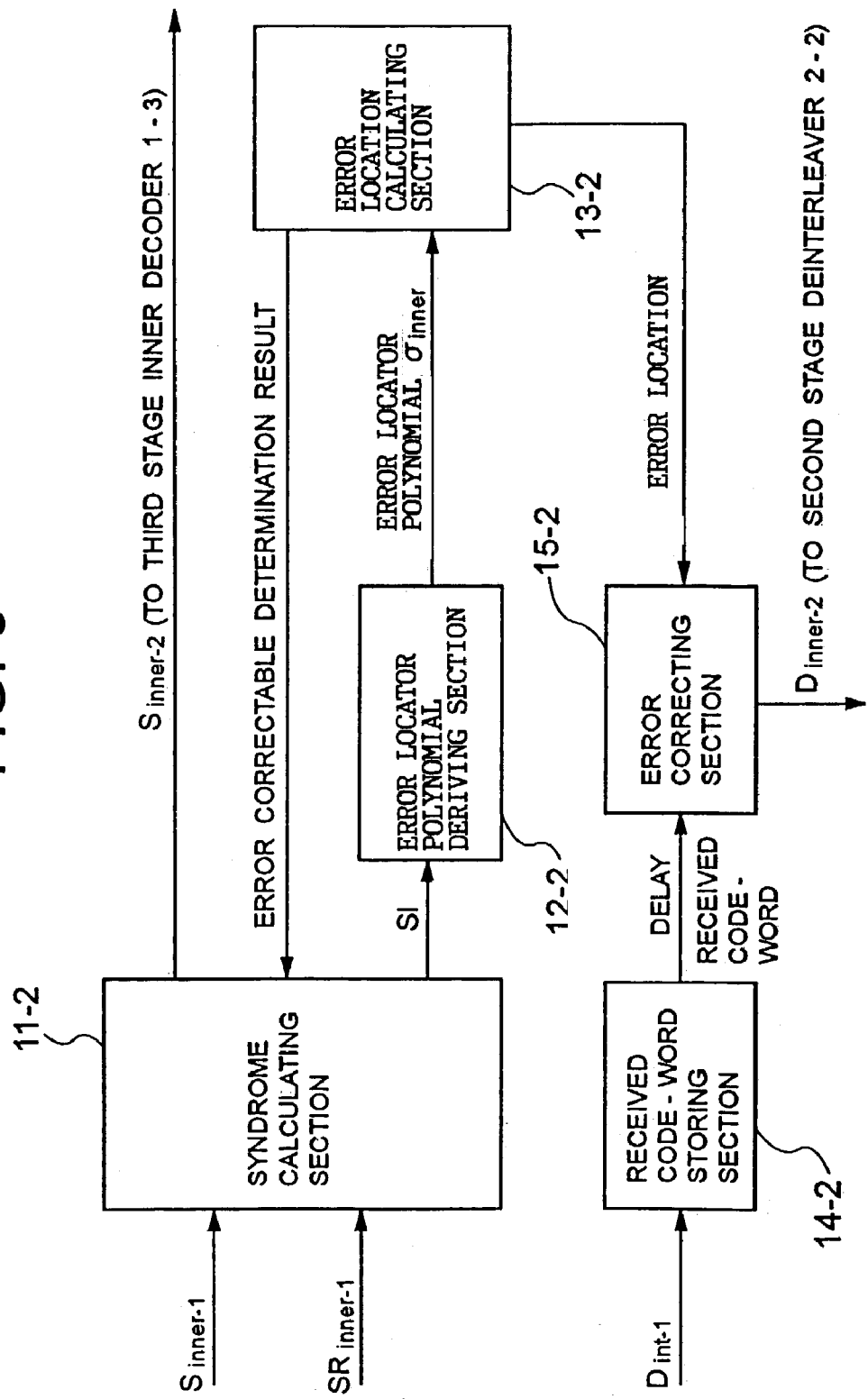
FIG. 3 is a block diagram showing a configuration of a second stage inner decoder of FIG. 1.

FIG. 3 is a block diagram showing a configuration of the second stage inner decoder 1-2 of FIG. 1. The second stage inner decoder 1-2 comprises a syndrome calculating section 11-2, an error locator polynomial deriving section 12-2, an error location calculating section 13-2, a received code-word storing section 14-2, and an error correcting section 15-2.

The syndrome calculating section 11-2 adds the first stage inner code syndrome coefficient $S_{inner-1}$ and the first stage inner code modification syndrome coefficient $SR_{inner-1}$, and outputs the addition result SI to the error locator polynomial deriving section 12-2. Also, the syndrome calculating section 11-2 outputs the second stage inner code syndrome coefficient $S_{inner-2}$ to the third stage inner decoder 1-3 on the basis of the error correctable determination result input from the error location calculating section 13-2.

If the errors are correctable, the second stage inner code syndrome coefficient $S_{inner-2}$ is zero, or if the errors are uncorrectable, the second stage inner code syndrome coefficient $S_{inner-2}$ is the syndrome coefficient SI.

A functional block performs the exactly same operation of the functional blocks as the first stage inner decoder 1-1, except for the syndrome calculating section 11-2. Each of the third stage to N-th stage inner decoders 1-3 to 1-N performs the same processing as the second stage inner decoder. However, the N-th stage inner decoder that is at the final stage does not output the inner code syndrome coefficient.

The first stage deinterleaver 2-1 makes the deinterleaving (format conversion) for the decoded data $D_{inner-1}$. The data after format conversion is the code-word of the outer code. The deinterleaved data $D_{deint-1}$ is output to the first stage outer decoder 3-1. Each of the second stage to N-th stage deinterleaver 2-2 to 2-N performs the same processing as the first stage deinterleaver 2-1.

The first stage interleaver 4-1 makes the interleaving (reverse format conversion opposite to the format conversion of deinterleaving). The data after format conversion is the code-word of the inner code. The first stage interleaver 4-1 outputs the interleaved data $D_{int-1}$ to the second stage inner decoder 1-2. Each of the second stage to (N−1)-th stage interleavers 4-1 to 4-(N−1) performs the same processing as the first stage interleaver 4-1.

When the depth of interleaving/deinterleaving is L, the outer code-word is decomposed into L inner code-words by the interleaver, and the inner code-word is decomposed into L outer code-words by the deinterleaver.

Figure 4:
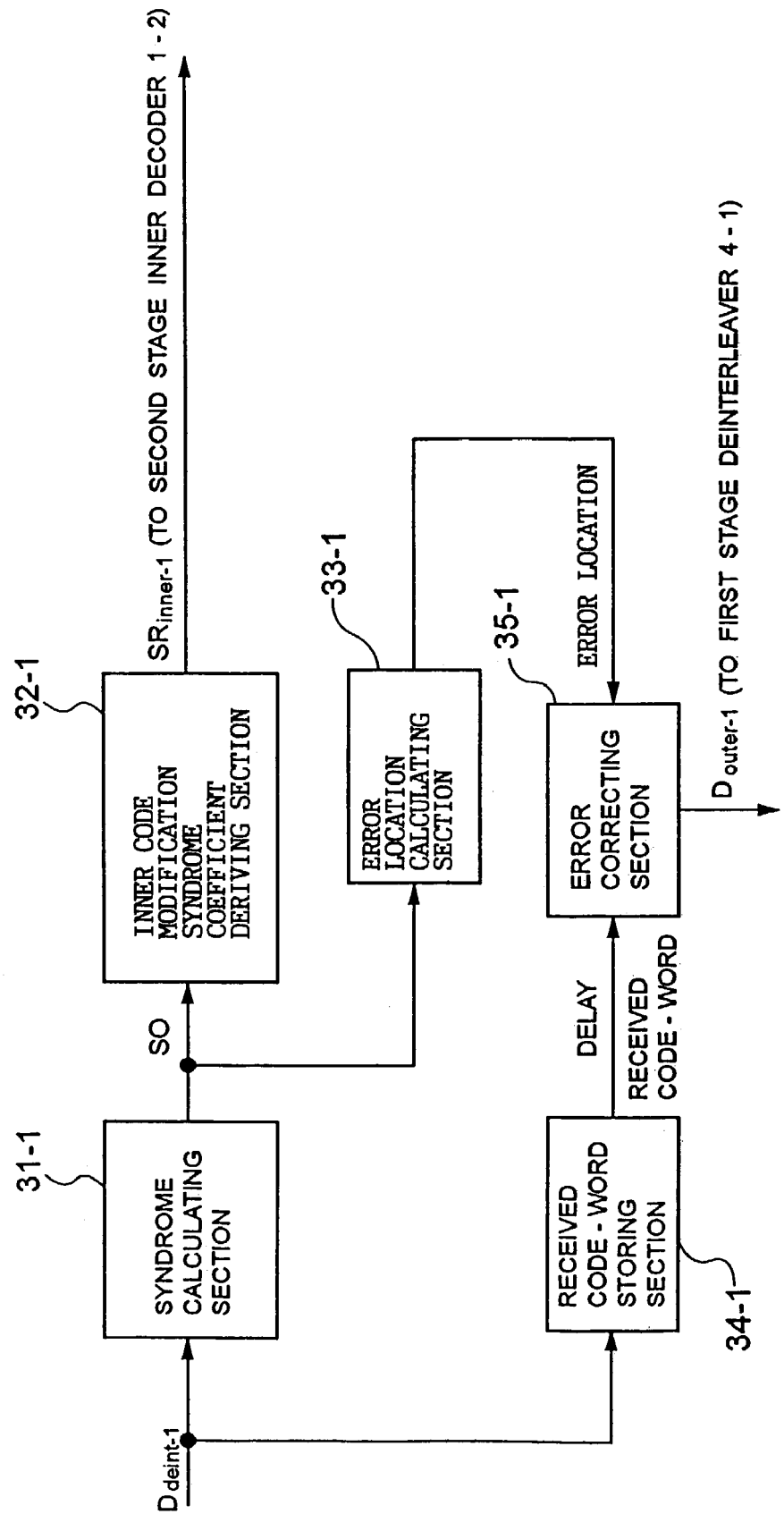
FIG. 4 is a block diagram showing a configuration of a first stage outer decoder of FIG. 1.

FIG. 4 is a block diagram showing a configuration of the first stage outer decoder 3-1 of FIG. 1. The first stage outer decoder 3-1 comprises a syndrome calculating section 31-1, an inner code modification syndrome coefficient deriving section 32-1, an error location calculating section 33-1, a received code-word storing section 34-1, and an error correcting section 35-1.

The syndrome calculating section 31-1 calculates the coefficients $SO_i$ (i=1, ..., $2*T_{outer}$) for a syndrome polynomial SO(z) that is defined by the expression, $$SO(z) = SO_1 z + SO_2 z^2 + \ldots + SO_j z^j$$

$$j = 2*T_{outer} \quad (10)$$

The syndrome coefficients $SO_i$ are defined by the expression, $$SO_i = Y_{outer} \times (\alpha_{outer})^i$$
$$= Y_0 + Y_1(\alpha_{outer})^i + Y_2(\alpha_{outer})^{2i} + \ldots + Y_k(\alpha_{outer})^{ki}$$
$$i = 1, \ldots, 2*T_{outer}$$

$$k = C_{outer} - 1 \quad (11)$$

where $Y_{outer}(x)$ is a received polynomial and $\alpha_{outer}$ is a primitive element for the Galois field.

Each coefficient of the received polynomial $Y_{outer}(x)$ corresponds to each bit of the deinterleaved data $D_{deint-1}$ input from the first stage deinterleaver 2-1. The syndrome coefficient $SO_i$ (i=1, ..., $2*T_{outer}$) is an element in the Galois field and is represented by the width of $M_{outer}$ bits. If the deinterleaved data $D_{deint-1}$ contains no error, the syndrome coefficients become all zero. The calculated syndrome coefficient $SO_i$ is output to the inner code modification syndrome coefficient deriving section 32-1 and the error location calculating section 33-1.

The inner code modification syndrome coefficient deriving section 32-1 derives the first stage inner code modification syndrome coefficient $SR_{inner-1}$ on the basis of the syndrome coefficients $SO_i$. The modification amount of the inner code syndrome coefficient by the outer code-word is derived using the ROM.

Since the outer code-word is decomposed into L inner code-words by the interleaver, the modification syndrome coefficients by the amount of the L inner code-words corresponding to the syndrome coefficient SO are output from the ROM, with the syndrome coefficient SO as an input address. The ROM has an address length of $M_{outer} \times 2*T_{outer}$ bits, and a word length of $L \times M_{inner} \times 2*T_{inner}$ bits. Since the area of the ROM is proportional to 2 to the power of (address length), in the conventional technique in which the outer code error correctable number ($T_{outer}$) is not small, the area of the ROM becomes very large, and is unrealistic. On the contrary, since the outer code error correctable number ($T_{outer}$) is small in the outer decoder of this invention, the ROM can be employed.

Since the inner code-word comprises L outer code-words, the addition result of the inner code syndrome coefficient modification amount by the L outer code-words is the first stage inner code modification syndrome coefficient $SR_{inner-1}$. The derived first stage inner code modification syndrome coefficient $SR_{inner-1}$ is output to the second stage inner decoder 1-2.

The error location calculating section 33-1 calculates the error location on the basis of the syndrome coefficient $SO_i$. The error location is represented by $M_{outer}$ bits per error. Since the syndrome coefficient $SO_i$ has a total of $M_{outer} \times 2*T_{outer}$ bits, the error location calculating section 33-1 can be implemented by the ROM having an address length of $M_{outer} \times 2*T_{outer}$ bits and one word length of $M_{outer} \times T_{outer}$ bits. The error correcting section 35-1 corrects the received code-word stored in the received code-word storing section 34-1 on the basis of the error location input from the error location calculating section 33-1, and outputs the decoded data $D_{outer-1}$ to the outside.

Each of the second stage to (N−1)-th stage outer decoders 3-2 to 3-(N−1) performs the same processing as the first stage outer decoder 3-1. The N-th stage outer decoder 3-N also performs the same processing as the first stage outer decoder 3-1, except that the inner code modification syndrome coefficient deriving section 32-1 is not provided.

In the conventional technique, the BCH code is employed for the inner code and the outer code having the almost same coding ratio. However, the iterative concatenated BCH decoding circuit of the invention employs the inner code having a high coding ratio and the outer code having a low coding ratio to reduce the circuit size and improve the correction capability.

Though the two-dimensional BCH code has been described above, this invention is applicable to the BCH code as a whole. Also, this invention is applicable to the Reed-Solomon code that is subspecific to the BCH code.

Figure 5:
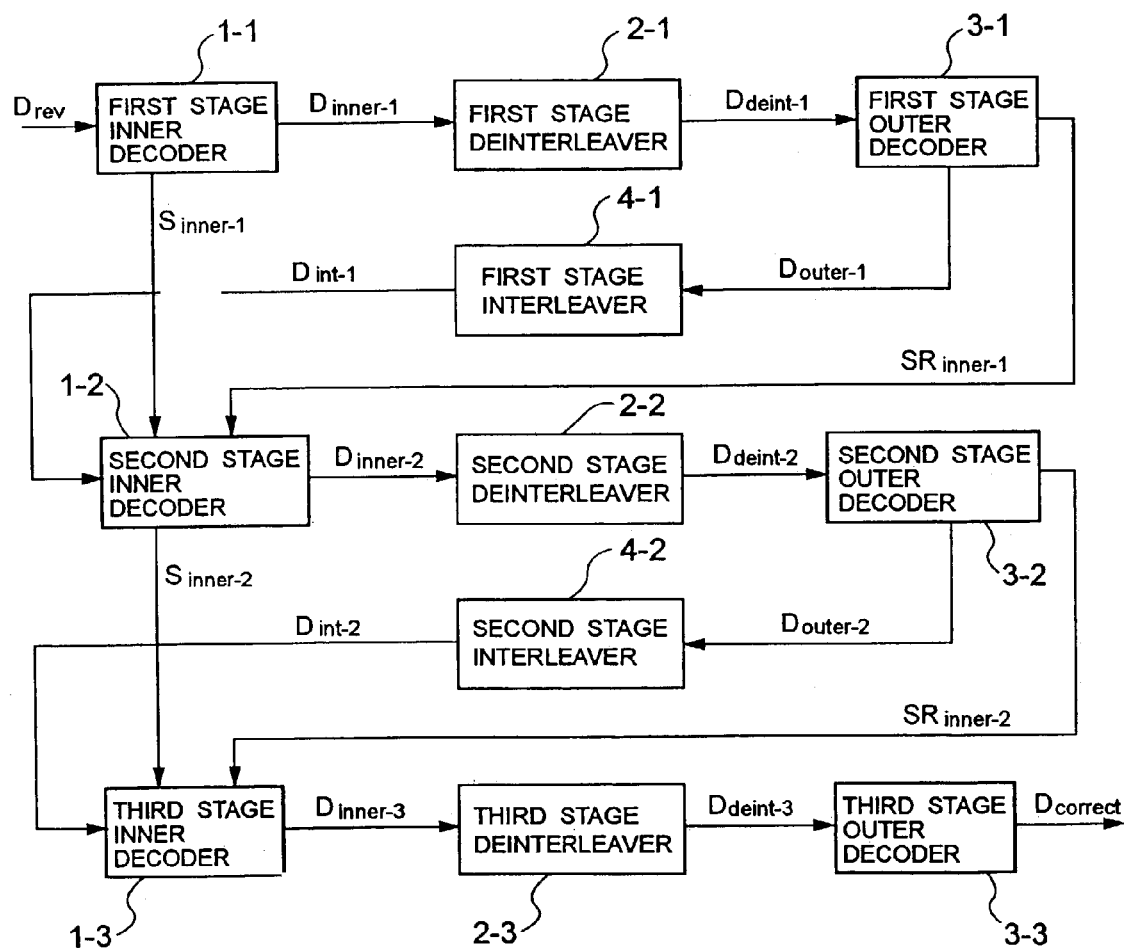
FIG. 5 is a block diagram showing a configuration of an iterative concatenated BCH decoding circuit according to one embodiment of the invention.

FIG. 5 is a block diagram showing a configuration of an iterative concatenated BCH decoding circuit according to one embodiment of the invention. It is assumed that the depth of interleaving/deinterleaving is 2, the code length of the inner code is 63 bits, the Galois field primitive polynomial order of the inner code is 6, the number of correctable bits per code-word of the inner code is 4, the code length of the outer code is 39 bits, the Galois field primitive polynomial order of the outer code is 6, the number of correctable bits per code-word of the outer code is 1, and the iterative number is 3, whereby the configuration of the iterative concatenated BCH decoding circuit is shown.

In FIG. 5, the iterative concatenated BCH decoding circuit according to one embodiment of the invention comprises the first stage to third stage inner decoders 1-1 to 1-3, the first stage to third stage deinterleavers 2-1 to 2-3, the first stage to third stage outer decoders 3-1 to 3-3, and the first stage and second stage interleavers 4-1 and 4-2.

The first stage inner decoder 1-1 inputs the encoded data $D_{rev}$ received through the transmission path, not shown, and outputs the decoded data $D_{inner-1}$ to the first stage deinterleaver 2-1. Also, the first stage inner decoder 1-1 outputs the first stage inner code syndrome coefficient $S_{inner-1}$ corresponding to the decoded data $D_{inner-1}$ to the second stage inner decoder 1-2.

The first stage deinterleaver 2-1 inputs the decoded data $D_{inner-1}$ and outputs the deinterleaved data $D_{deint-1}$ to the first stage outer decoder 3-1. The first stage outer decoder 3-1 outputs the decoded data $D_{outer-1}$ to the first stage interleaver 4-1. Also, the first stage outer decoder 3-1 derives the first stage inner code modification syndrome coefficient $SR_{inner-1}$ on the basis of the deinterleaved data $D_{deint-1}$ and outputs it to the second stage inner decoder 1-2. The first stage interleaver 4-1 inputs the decoded data $D_{outer-1}$ and outputs the interleaved data $D_{int-1}$ to the second stage inner decoder 1-2.

The second stage inner decoder 1-2 inputs the first stage inner code syndrome coefficient $S_{inner-1}$, the first stage inner code modification syndrome coefficient $SR_{inner-1}$, and the interleaved data $D_{int-1}$, decodes the interleaved data $D_{int-1}$ on the basis of the first stage inner code syndrome coefficient $S_{inner-1}$ and the first stage inner code modification syndrome coefficient $SR_{inner-1}$, and outputs the decoded data $D_{inner-2}$ to the second stage deinterleaver 2-2. Also, the second stage inner decoder 1-2 outputs the second stage inner code syndrome coefficient $S_{inner-2}$ for the decoded data $D_{inner-2}$ to the third stage inner decoder 1-3.

The second stage deinterleaver 2-2 inputs the decoded data $D_{inner-2}$ and outputs the deinterleaved data $D_{deint-2}$ to the second stage outer decoder 3-2. The second stage outer decoder 3-2 inputs the deinterleaved data $D_{deint-2}$ and outputs the decoded data $D_{outer-2}$ to the second stage interleaver 4-2. Also, the second stage outer decoder 3-2 derives the second stage inner code modification syndrome coefficient $SR_{inner-2}$ on the basis of the deinterleaved data $D_{deint-2}$ and outputs it to the third stage inner decoder 1-3. The second stage interleaver 4-2 inputs the decoded data $D_{outer-2}$ and outputs the interleaved data $D_{int-2}$ to the third stage inner decoder 1-3.

The third stage inner decoder 1-3 inputs the second stage inner code syndrome coefficient $S_{inner-2}$, the second stage inner code modification syndrome coefficient $SR_{inner-2}$, and the interleaved data $D_{int-2}$, decodes the interleaved data $D_{int-2}$ on the basis of the second stage inner code syndrome coefficient $S_{inner-2}$ and the second stage inner code modification syndrome coefficient $SR_{inner-2}$, and outputs the decoded data $D_{inner-3}$ to the third stage deinterleaver 2-3.

The third stage deinterleaver 2-3 inputs the decoded data $D_{inner-3}$ and outputs the deinterleaved data $D_{deint-3}$ to the third stage outer decoder 3-3. The third stage outer decoder 3-3 inputs the deinterleaved data $D_{deint-3}$ and outputs the concatenated code decoded data $D_{correct}$.

The first stage inner decoder 1-1 of this embodiment has the same configuration as shown in FIG. 2 described above, and comprises a syndrome calculating section 11-1, an error locator polynomial deriving section 12-1, an error location calculating section 13-1, a received code-word storing section 14-1, and an error correcting section 15-1.

The syndrome calculating section 11-1 inputs the encoded data $D_{rev}$ received through the transmission path, and outputs the calculated syndrome coefficient SI to the error locator polynomial deriving section 12-1. Also, the syndrome calculating section 11-1 outputs the first stage inner code syndrome coefficient $S_{inner-1}$ having a value of zero to the second stage inner decoder 1-2, if the error correctable determination result input from an error location calculating section 13-1 is error correctable, or otherwise, outputs the syndrome coefficient SI as the first stage inner code syndrome coefficient $S_{inner-1}$.

The error locator polynomial deriving section 12-1 inputs the syndrome coefficient SI, and outputs the error locator polynomial coefficient $\sigma_{inner}$ to the error location calculating section 13-1. The error location calculating section 13-1 inputs the error locator polynomial coefficient $\sigma_{inner}$, and outputs the derived error location to the error correcting section 15-1. Also, the error location calculating section 13-1 outputs the error correctable determination result to the syndrome calculating section 11-1.

The received code-word storing section 14-1 inputs the encoded data $D_{rev}$ received through the transmission path, and outputs a delay received code-word to the error correcting section 15-1. The error correcting section 15-1 inputs the error location output from the error location calculating section 13-1 and the delay received code-word output from the received code-word storing section 14-1 and outputs the decoded data $D_{inner-1}$ to the first stage deinterleaver 2-1.

The second stage inner decoder 1-2 of this embodiment has the same configuration as shown in FIG. 3 described above, and comprises a syndrome calculating section 11-2, an error locator polynomial deriving section 12-2, an error location calculating section 13-2, a received code-word storing section 14-2, and an error correcting section 15-2.

The syndrome calculating section 11-2 inputs the first stage inner code syndrome coefficient $S_{inner-1}$ and the first stage inner code modification syndrome coefficient $SR_{inner-1}$, and outputs the addition result as the syndrome coefficient SI to the error locator polynomial deriving section 12-2. Also, the syndrome calculating section 11-2 outputs the second stage inner code syndrome coefficient $S_{inner-2}$ having a value of zero to the third stage inner decoder 1-3, if the error correctable determination result input from the error location calculating section 13-2 is error correctable, or otherwise, outputs the syndrome coefficient SI as the second stage inner code syndrome coefficient $S_{inner-2}$.

The functional block has the same configuration of the functional blocks as the first stage inner decoder 1-1, except for the syndrome calculating section 11-2. The third stage inner decoder 1-3 has the same configuration as the second stage inner decoder 1-2, except that the inner code syndrome coefficient is not output at the last stage.

The first stage outer decoder 3-1 of this embodiment has the same configuration as shown in FIG. 4 described above, and comprises a syndrome calculating section 31-1, an inner code modification syndrome coefficient deriving section 32-1, an error location calculating section 33-1, a received code-word storing section 34-1, and an error correcting section 35-1.

The syndrome calculating section 31-1 inputs the deinterleaved data $D_{deint-1}$ from the first stage deinterleaver 2-1, and calculates the syndrome coefficient SO. The calculated syndrome coefficient SO is output to the inner code modification syndrome coefficient deriving section 32-1 and the error location calculating section 33-1.

The inner code modification syndrome coefficient deriving section 32-1 inputs the syndrome coefficient SO, and derives the first stage inner code modification syndrome coefficient $SR_{inner-1}$. The derived first stage inner code modification syndrome coefficient $SR_{inner-1}$ is output to the second stage inner decoder 1-2.

The error location calculating section 33-1 inputs the syndrome coefficient SO and outputs the error value to the error correcting section 35-1. The received code-word storing section 34-1 inputs the deinterleaved data $D_{deint-1}$ from the first stage deinterleaver 2-1, and outputs the delay received code-word to the error correcting section 35-1. The error correcting section 35-1 inputs the error location from the error location calculating section 33-1 and the delay received code-word from the received code-word storing section 34-1 and outputs the decoded data $D_{outer-1}$ to the first stage interleaver 4-1.

The second stage outer decoder 3-2 has the same configuration as the first stage outer decoder 3-1. The third stage outer decoder 3-3 has the same configuration as the first stage outer decoder 3-1, except that the inner code modification syndrome coefficient deriving section is not provided.

Referring to FIGS. 2 to 5, the operation of the iterative concatenated BCH decoding circuit according to one embodiment of this invention will be described below. In the iterative concatenated BCH decoding circuit, it is assumed that the depth of interleaving/deinterleaving is 2, the code length of the inner code is 63 bits, the Galois field primitive polynomial order of the inner code is 6, the number of correctable bits per code-word of the inner code is 4, the check data length of the inner code is 24 bits, the information data length of the inner code is 39 bits, the code length of the outer code is 39 bits, the check data length of the outer code is 6 bits, the information data length of the outer code is 33 bits, the Galois field primitive polynomial order of the outer code is 6, the number of correctable bits per code-word of the outer code is 1, and the iterative number is 3.

First of all, at the first stage, the first stage inner decoder 1-1 decodes the encoded data $D_{rev}$ received through the transmission path, and outputs the decoded data $D_{inner-1}$ to the first stage deinterleaver 2-1. Also, the first stage inner decoder 1-1 outputs the first stage inner code syndrome coefficient $S_{inner-1}$ corresponding to the decoded data $D_{inner-1}$ to the second stage inner decoder 1-2. The first stage inner code syndrome coefficient $S_{inner-1}$ is zero if the encoded data $D_{rev}$ is correctable code-word, or is the syndrome coefficient for the encoded data $D_{rev}$ derived at the time of decoding, if it is uncorrectable code-word.

The first deinterleaver 2-1 deinterleaves the decoded data $D_{inner-1}$, and outputs the deinterleaved data $D_{deint-1}$ to the first stage outer decoder 3-1. The first stage outer decoder 3-1 derives the first stage inner code modification syndrome coefficient $SR_{inner-1}$ on the basis of the deinterleaved data $D_{deint-1}$, and outputs it to the second stage inner decoder 1-2. Also, the first stage outer decoder 3-1 decodes the deinterleaved data $D_{deint-1}$, and outputs the decoded data $D_{outer-1}$ to the first stage interleaver 4-1. The first stage interleaver 4-1 interleaves the decoded data $D_{outer-1}$, and outputs the interleaved data $D_{int-1}$ to the second stage inner decoder 1-2.

At the second stage, the second stage inner decoder 1-2 decodes the interleaved data $D_{int-1}$ on the basis of the first stage inner code syndrome coefficient $S_{inner-1}$ and the first stage inner code modification syndrome coefficient $SR_{inner-1}$, and outputs the decoded data $D_{inner-2}$ to the second stage deinterleaver 2-2. Also, the second stage inner decoder 1-2 outputs the second stage inner code syndrome coefficient $S_{inner-2}$ corresponding to the decoded data $D_{inner-2}$ to the third stage inner decoder 1-3.

The second deinterleaver 2-2 deinterleaves the decoded data $D_{inner-2}$, and outputs the deinterleaved data $D_{deint-2}$ to the second stage outer decoder 3-2. The second stage outer decoder 3-2 derives the second stage inner code modification syndrome coefficient $SR_{inner-2}$ on the basis of the deinterleaved data $D_{deint-2}$ and outputs it to the third stage inner decoder 1-3. Also, the second stage outer decoder 3-2 decodes the deinterleaved data $D_{deint-2}$ and outputs the decoded data $D_{outer-2}$ to the second stage interleaver 4-2. The second stage interleaver 4-2 interleaves the decoded data $D_{outer-2}$, and outputs the interleaved data $D_{int-2}$ to the third stage inner decoder 1-3.

Moreover, at the third stage, the third stage inner decoder 1-3 decodes the interleaved data $D_{int-2}$ on the basis of the second stage inner code syndrome coefficient $S_{inner-2}$ and the second stage inner code modification syndrome coefficient $SR_{inner-2}$, and outputs the decoded data $D_{inner-3}$ to the third stage deinterleaver 2-3. The third deinterleaver 2-3 deinterleaves the decoded data $D_{inner-3}$, and outputs the deinterleaved data $D_{deint-3}$ to the third stage outer decoder 3-3. The third stage outer decoder 3-3 decodes the deinterleaved data $D_{deint-3}$ and outputs the concatenated code decoded data $D_{correct}$.

Next, the detailed operation of each functional block will be described below. To begin with, the operation of the first stage to third stage inner decoders 1-1 to 1-3 will be described below.

The syndrome calculating section 11-1 calculates the coefficients $SI_i$ (i=1, 2, . . . , 8) for a syndrome polynomial $SI(z)$ that is defined by the expression, $$SI(z) = SI_1 z + SI_2 z^2 + \ldots + SI_8 z^8 \tag{12}$$

The syndrome coefficients $SI_i$ are defined by the expression, $$\begin{aligned} SI_i &= Y_{inner}(\alpha^i) \\ &= Y_0 + Y_1(\alpha_{inner})^i + Y_2(\alpha_{inner})^{2i} + \ldots + Y_{62}(\alpha_{inner})^{62i} \\ i &= 1, 2, \ldots, 8 \end{aligned} \tag{13}$$

where $Y_{inner}(x)$ is a received polynomial and $\alpha_{inner}$ is a primitive element for the Galois field.

Each coefficient of the received polynomial $Y_{inner}(x)$ corresponds to each bit of the encoded data $D_{rev}$ received through the transmission path. The syndrome coefficient $SI_i$ is an element in the Galois field and is represented by the width of 6 bits. If the encoded data $D_{rev}$ received through the transmission path contains no error, the syndrome coefficients become all zero. For example, if the errors occur in the encoded data $D_{rev}$ corresponding to the fifth and tenth order coefficients of the received polynomial $Y_{inner}(x)$, the syndrome coefficient $SI_i$ is represented by the expression, $$SI_i = (\alpha_{inner})^{5i} + (\alpha_{inner})^{10i}$$

$$i = 1, 2, \ldots, 8 \tag{14}$$

The calculated syndrome coefficient $SI_i$ is output to the error locator polynomial deriving section 12-1. Also, the syndrome calculating section 11-1 outputs the syndrome coefficient for the decoded data $D_{inner-1}$ by the first stage inner decoder 1-1 as the first stage inner code syndrome coefficient $S_{inner-1}$ to the second stage inner decoder 1-2.

If the errors in the received polynomial $Y_{inner}(x)$ are less than or equal to an error correctable bit number (4 bits), the errors are all corrected, and zero is output as the first stage inner code syndrome coefficient $S_{inner-1}$. If the errors in the received polynomial $Y_{inner}(x)$ are more than an error correctable bit number (4 bits), the error is not corrected, and the encoded data $D_{rev}$ received through the transmission path is directly output as the decoded data $D_{inner-1}$, whereby the syndrome coefficient $SI_i$ derived by the syndrome calculating section 11-1 is output as the first stage inner code syndrome coefficient $S_{inner-1}$. The error location calculating section 13-1 determines whether or not the errors are correctable, and the determination result is input into the syndrome calculating section 11-1.

The error locator polynomial deriving section 12-1 derives an error locator polynomial $\sigma_{inner}(z)$, employing the Euclid's algorithm on the basis of the syndrome coefficients $SI_i$, and outputs it to the error location calculating section 13-1. The error locator polynomial $\sigma_{inner}(z)$ is represented by the expression, $$\sigma_{inner}(z)=\sigma_0+\sigma_1 z+\ldots+\sigma_4 z^4 \qquad (15)$$

The error location calculating section 13-1 derives an error location from the error locator polynomial $\sigma_{inner}(z)$, and outputs it to the error correcting section 15-1. Substituting successively $\alpha_{inner}$ to the i-th power or $(\alpha_{inner})^i$ (i=1, ..., 63) into the error locator polynomial $\sigma_{inner}(z)$, if $\sigma_{inner}[(\alpha_{inner})^i]$ is equal to 0, the errors have occurred in the received code-word of (63-i)-th order component.

The error location obtained by the Chien search algorithm is output to the error correcting section 15-1. However, if the number of errors is not matched with the order of the error locator polynomial $\sigma_{inner}(z)$, the error is determined to be uncorrectable, and the error location is not output to the error correcting section 15-1. This error correctable determination result is also output to the syndrome calculating section 11-1.

The error correcting section 15-1 corrects the received code-word stored in the received code-word storing section 14-1 on the basis of the error location input from the error location calculating section 13-1, and outputs the decoded data $D_{inner-1}$ to the first stage deinterleaver 2-1.

The error locator polynomial deriving section 12-2, the error location calculating section 13-2, the received code-word storing section 14-2, and the error correcting section 15-2 perform the exactly same operation as those of the first stage inner decoder 1-1.

The syndrome calculating section 11-2 adds the first stage inner code syndrome coefficient $S_{inner}$ and the first stage inner code modification syndrome coefficient $SR_{inner-1}$, and outputs the addition result SI to the error locator polynomial deriving section 12-2. Also, the syndrome calculating section 11-2 outputs the syndrome coefficient for the decoded data $D_{inner-2}$ by the second stage inner decoder 1-2 as the second stage inner code syndrome coefficient $S_{inner-2}$ to the third stage inner decoder 1-3. If the error correctable determination result input from the error location calculating section 13-2 is error correctable, zero is output, or otherwise, the addition result SI is output as the second stage inner code syndrome coefficient $S_{inner-2}$.

For example, in a case where the $62^{nd}$, $61^{st}$, $60^{th}$, $59^{th}$, and $58^{th}$ order coefficients of the received polynomial for the first stage inner decoder 1-1 have errors, the error is not corrected by the first stage inner decoder 1-1, because the error has 4 bits or more. Thereafter, if the error corresponding to the $62^{nd}$ order coefficient of the received polynomial is corrected in the first stage outer decoder 3-1, the first stage inner code syndrome coefficient $S_{inner-1}$ and the first stage inner code modification syndrome coefficient $SR_{inner-1}$ are represented by the expressions, i-th order component of $S_{inner-1}=(\alpha_{inner})^{58i}+(\alpha_{inner})^{59i}+(\alpha_{inner})^{60i}+(\alpha_{inner})^{61i}+(\alpha_{inner})^{62i}$ (16)

i=1, ..., 8i-th order component of $SR_{inner-1}=(\alpha_{inner})^{62i}$ i=1, ..., 8 (17)

Accordingly, the addition result SI is represented by the expression, $$SI_i=(\alpha_{inner})^{58i}+(\alpha_{inner})^{59i}+(\alpha_{inner})^{60i}+(\alpha_{inner})^{61i} i=1, \ldots, 8 \qquad (18)$$

The addition result SI represented by the expression (18) is coincident with the syndrome coefficient, when the $61^{st}$, $60^{th}$, $59^{th}$, and $58^{th}$ order coefficients of the received polynomial have errors. In this case, because the number of errors is in a correctable range (4 bits or less), the error locator polynomial deriving section 12-2, the error location calculating section 13-2, the received code-word storing section 14-2, and the error correcting section 15-2 derive the error location and correct the error.

The third stage inner decoder 1-3 performs the same operation as the second stage inner decoder 1-2 as above. However, since the third stage inner decoder 1-3 is at the last stage, the inner code syndrome coefficient is not output.

Figure 6:
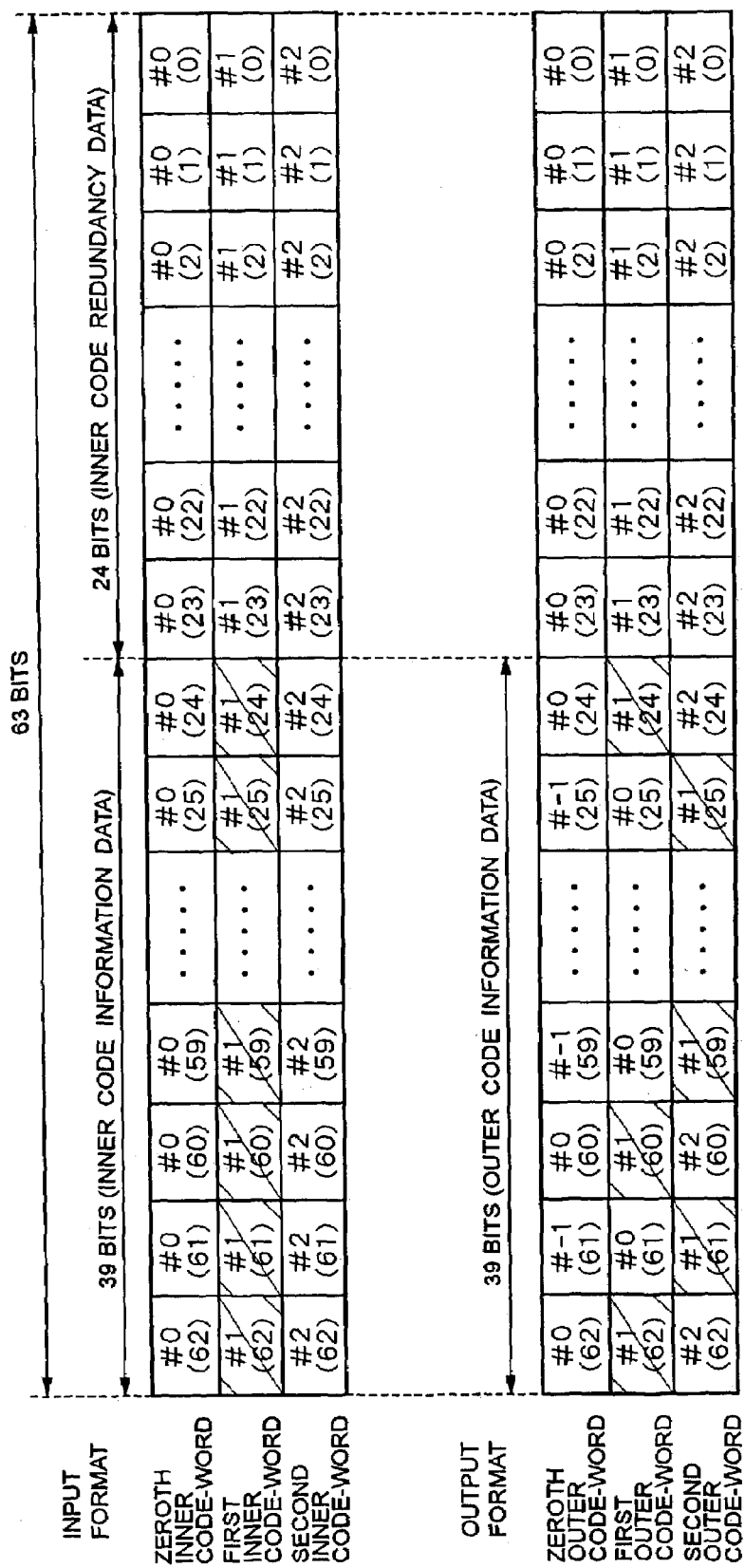
FIG. 6 is a table showing a format conversion example by first stage to third stage deinterleavers of FIG. 5.
Figure 7:
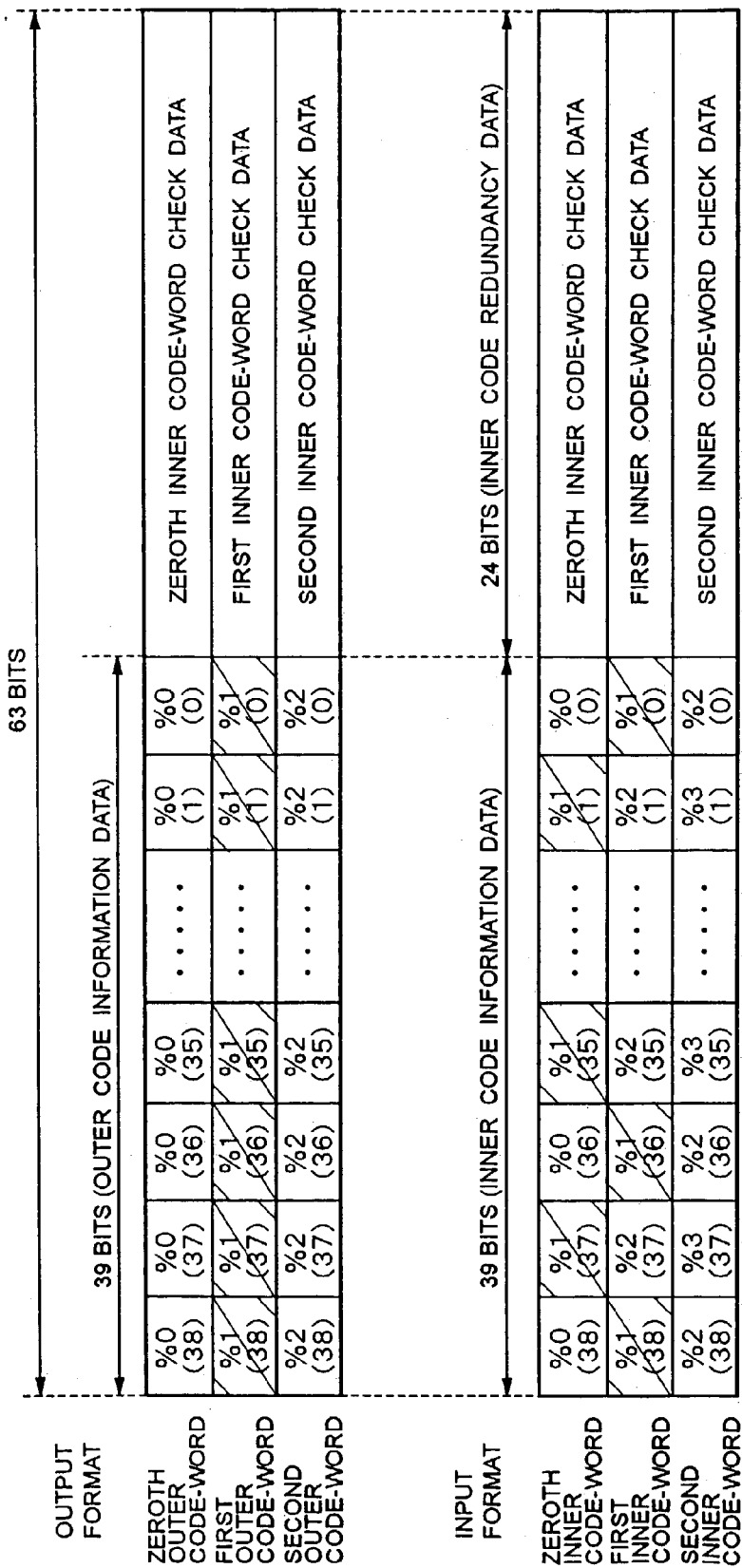
FIG. 7 is a table showing a format conversion example by first stage and second stage interleavers of FIG. 5.

FIG. 6 is a table showing an example of the format conversion by the first stage to third stage deinterleavers 2-1 to 2-3 of FIG. 5. FIG. 7 is a table showing an example of the format conversion by the first stage and second stage interleavers 4-1 and 4-2 of FIG. 5. The operation of the first stage to third stage deinterleavers 2-1 to 2-3 and the first stage and second stage interleavers 4-1 and 4-2 will be described below.

Each of the first stage to third stage deinterleavers 2-1 to 2-3 makes the format conversion as shown in FIG. 6. In FIG. 6, #X(Y) denotes the Y-th order component in the X-th inner code-word. The oblique line portion in FIG. 6 indicates the information data component ($62^{nd}$ to $24^{th}$ order) of the first inner code-word. As shown in FIG. 6, the information data component of the inner code-word is decomposed into two (=depth of interleaving) outer code-words. Taking notice of the information data of the first inner code-word, the $62^{nd}$ order component is decomposed into the $38^{th}$ order component of the first outer code-word and the $61^{st}$ order component into the $37^{th}$ order component of the second outer code-word.

Each of the first stage and second stage interleavers 4-1 and 4-2 makes the reverse conversion of the deinterleaver, or the format conversion as shown in FIG. 7. %X(Y) denotes the Y-th order component in the X-th outer code-word. The oblique line portion in FIG. 7 indicates the first outer code-word. As shown in FIG. 7, the outer code-word is decomposed into two (=depth of interleaving) inner code-words. Taking notice of the first outer code-word, the $38^{th}$ order component is decomposed into the $62^{nd}$ order component of the first inner code-word and the $37^{th}$ order component into the $61^{st}$ order component of the zeroth inner code-word.

In the interleaving/deinterleaving method in which the information data component of the inner code-word is evenly decomposed into a plurality of outer code-words, there is no problem if other methods than that of this embodiment are employed.

The syndrome calculating section 31-1 of the first outer decoder 3-1 calculates the coefficients $SO_i$ (i=1, 2) for a syndrome polynomial $SO(z)$ that is defined by the expression, $$SO(z)=SO_1 z+SO_2 z^2 \qquad (19)$$

The syndrome coefficients $SO_i$ are defined by the expression, $$SO_i = Y_{outer} \times (\alpha_{outer})^i \qquad (20)$$
$$= Y_0 + Y_1(\alpha_{outer})^i + Y_2(\alpha_{outer})^{2i} + Y_3(\alpha_{outer})^{3i} + \ldots + Y_{38}(\alpha_{outer})^{38i}$$
$$i = 1, 2$$

where $Y_{outer}(x)$ is a received polynomial and $\alpha_{outer}$ is a primitive element for the Galois field.

Each coefficient of the received polynomial $Y_{outer}(x)$ corresponds to each bit of the deinterleaved data $D_{deint-1}$ input from the first stage deinterleaver 2-1. The syndrome coefficient $SO_i$ is an element in the Galois field and is represented by the width of 6 bits. If the deinterleaved data $D_{deint-1}$ contains no error, the syndrome coefficients become all zero. The calculated syndrome coefficient $SO_i$ is output to the inner code modification syndrome coefficient deriving section 32-1 and the error location calculating section 33-1.

The inner code modification syndrome coefficient deriving section 32-1 generates the first stage inner code modification syndrome coefficient $SR_{inner-1}$ on the basis of the syndrome coefficients $SO_i$. The modification amount of the inner code syndrome coefficient by the outer code-word is calculated using the ROM with the syndrome coefficient $SO_i$ as the input address. Since the outer code-word is decomposed into two inner code-words by the interleaver, the modification syndrome coefficients by the amount of two inner code-words are output from the ROM. The ROM has an address length of 12 (=6×2) bits, and a word length of 96 [=2×6×(2*4)] bits. Since the inner code-word comprises two outer code-words, the addition result of the inner code syndrome coefficient modification amount by two outer code-words is the first stage inner code modification syndrome coefficient $SR_{inner-1}$. The derived first stage inner code modification syndrome coefficient $SR_{inner-1}$ is output to the second stage inner decoder 1-2.

The operation of the inner code modification syndrome coefficient deriving section 32-1 will be described below, employing an example in which the $38^{th}$ order component of the zeroth outer code-word and the $37^{th}$ order component of the first outer code-word have errors. In this case, the interleaving/deinterleaving method is one as shown in FIGS. 6 and 7.

The zeroth outer code-word is decomposed into the zeroth inner code-word and the $(-1^{st})$ inner code-word. Accordingly, when the syndrome coefficient of the zeroth outer code-word is input, the syndrome coefficient modification amounts of the zeroth inner code-word and the $(-1^{st})$ inner code-word are output from the ROM. Since the $38^{th}$ order component of the zeroth outer code-word where the error occurs corresponds to the $68^{th}$ order component of the zeroth inner code-word, $[(\alpha_{inner})^{68}, (\alpha_{inner})^{68*2}, \ldots, (\alpha_{inner})^{68*8}]$ is output as the syndrome coefficient modification amount of the zeroth inner code-word from the ROM.

Also, [0, 0, 0, 0, 0, 0, 0, 0] is output as the syndrome coefficient modification amount of the $(-1^{st})$ inner code-word. The syndrome coefficient modification amount of the zeroth inner code-word output from the ROM is saved in a register, not shown.

The first outer code-word is decomposed into the zeroth inner code-word and the first inner code-word. Accordingly, when the syndrome coefficient of the first outer code-word is input, the syndrome coefficient modification amounts of the zeroth inner code-word and the first inner code-word are output from the ROM. Since the $37^{th}$ order component of the first outer code-word where the error occurs corresponds to the $67^{th}$ order component of the zeroth inner code-word, $[(\alpha_{inner})^{67}, (\alpha_{inner})^{67*2}, \ldots, (\alpha_{inner})^{67*8}]$ is output as the syndrome coefficient modification amount of the zeroth inner code-word from the ROM. Also, [0, 0, 0, 0, 0, 0, 0, 0] is output as the syndrome coefficient modification amount of the first inner code-word.

The inner code modification syndrome coefficient deriving section 32-1 outputs the addition result $[(\alpha_{inner})^{67}+(\alpha_{inner})^{68}, (\alpha_{inner})^{67*2}+(\alpha_{inner})^{68*2}, \ldots, (\alpha_{inner})^{67*8}+(\alpha_{inner})^{68*8}]$ of the syndrome coefficient modification amount of the zeroth inner code-word calculated when the zeroth outer code-word is decoded, and the syndrome coefficient modification amount of the zeroth inner code-word calculated when the first outer code-word is decoded, as the first stage inner code modification syndrome coefficient $SR_{inner-1}$. This first stage inner code modification syndrome coefficient $SR_{inner-1}$ is coincident with the inner code syndrome coefficient when the $68^{th}$ order component and the $67^{th}$ order component of the inner code-word have errors.

The error location calculating section 33-1 calculates the error location on the basis of the syndrome coefficient $SO_i$ (i=1, 2). The error location is represented by 6 bits per error. Since the syndrome coefficient $SO_i$ has a total of 12 (=6×2) bits, the error location calculating section 33-1 is implemented by the ROM having an address length of 12 bits and one word length of 6 bits.

The error correcting section 35-1 corrects the received code-word stored in the received code-word storing section 34-1 on the basis of the error location input from the error location calculating section 33-1, and outputs the decoded data $D_{outer-1}$ to the outside.

The second stage outer decoder 3-2 performs the same processing as the first stage outer decoder 3-1. The third stage outer decoder 3-3 performs the same processing as the first stage outer decoder 3-1, except that the inner code modification syndrome coefficient deriving section is not provided.

In the conventional technique, the BCH code is employed for the inner code and the outer code having the same coding ratio. However, if the iterative concatenated BCH decoding circuit of the invention employs the inner code having a high coding ratio and the outer code having a low coding ratio to reduce the scale of the circuit configuration and improve the correction capability.

In this way, the outer decoder of this embodiment has no need of the error locator polynomial deriving section using the Euclid's algorithm and the error location calculating section using the Chien search algorithm, which were needed in the conventional technique, whereby the circuit configuration of the outer decoder can be reduced. The outer decoder having a low coding ratio acquires the error location and the inner code modification syndrome coefficient, using the ROM.

The inner decoder of this embodiment at the second and ensuing stages has no need of obtaining the syndrome coefficient from the received polynomial, unlike the conventional technique, whereby the circuit configuration can be reduced. The inner decoder of this embodiment at the second and ensuing stages makes the decoding on the basis of the result of adding the syndrome coefficient S of the inner decoder at the former stage and the inner code modification syndrome coefficient SR calculated by the outer decoder at the former stage.

Moreover, the high error correcting capability can be realized by employing the inner code having a high coding ratio and the outer code having a low coding ratio. In the BCH code, when an average error number of the received code-word is greater than or equal to the number of correctable bits, the errors are hardly corrected. In the inner decoder in the iterative concatenated BCH decoding circuit of this embodiment has a higher coding ratio than the inner decoder of the conventional technique having the same coding ratio, namely, a greater number of correctable bits. Therefore, even if the inner decoder of the conventional technique can not correct the errors because the input error rates are bad, the inner decoder of this embodiment can correct the errors.

Since the outer decoder may correct the remaining errors that are not corrected by the inner decoder, there is no problem even though the correctable bit number is small (coding ratio is low) as in the outer decoder of this embodiment.

On one hand, in the conventional technique, since the outer decoder has an coding ratio comparable to that of the inner decoder, when the inner decoder can hardly correct the errors, the outer decoder can also hardly correct the errors.

The typical decoding circuits of the BCH code and the Reed-Solomon code can be realized with the same circuit configuration as the two-dimensional BCH code. Accordingly, this embodiment provides the same effect for the BCH code and the Reed-Solomon code as described above.

Figure 8:
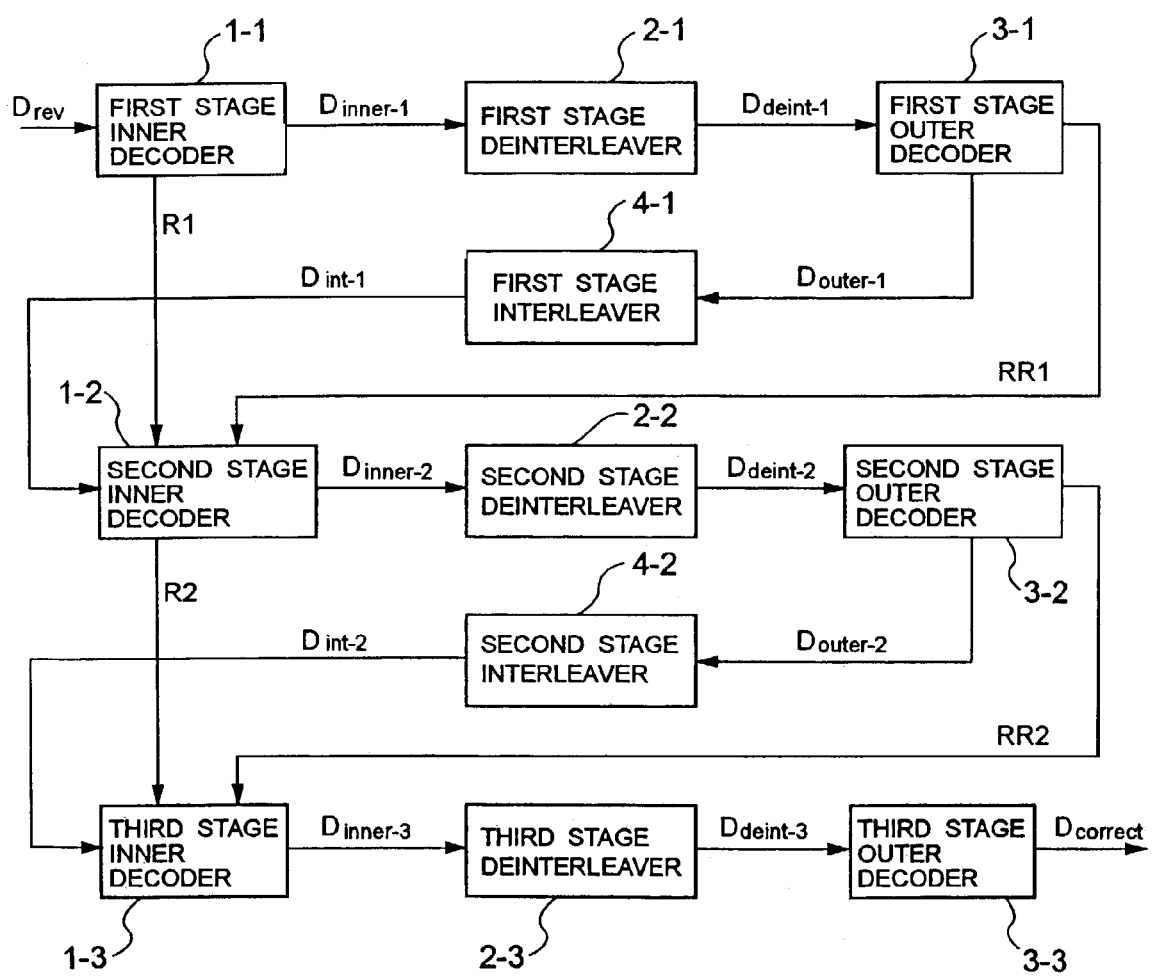
FIG. 8 is a block diagram showing a configuration of an iterative concatenated BCH decoding circuit according to another embodiment of the invention.

FIG. 8 is a block diagram showing the configuration of an iterative concatenated BCH decoding circuit according to another embodiment of the invention. It is assumed that the depth of interleaving/deinterleaving is 2, the code length of the inner code is 63 bits, the Galois field primitive polynomial order of the inner code is 6, the number of correctable bits per code-word of the inner code is 4, the check data length of the inner code is 24 bits, the information data length of the inner code is 39 bits, the code length of the outer code is 39 bits, the check data length of the outer code is 6 bits, the information data length of the outer code is 33 bits, the Galois field primitive polynomial order of the outer code is 6, the number of correctable bits per code-word of the outer code is 1, and the iterative number is 3.

The iterative concatenated BCH decoding circuit according to another embodiment of the invention comprises the first stage to third stage inner decoders 1-1 to 1-3, the first stage to third stage deinterleavers 2-1 to 2-3, the first stage to third stage outer decoders 3-1 to 3-3, and the first stage and second stage interleavers 4-1 and 4-2.

In one embodiment of this invention, each of the inner decoders at the second and ensuing stages makes the decoding on the basis of the result of adding the syndrome coefficient S of the inner decoder at the previous stage and the inner code modification syndrome coefficient SR calculated in the outer decoder at the previous stage. However, in another embodiment of this invention, each of the inner decoders at the second and ensuing stages makes the decoding on the basis of the result of adding the residual polynomials R1 and R2 output from the inner decoder at the previous stage and the inner code modification residual polynomials RR1 and RR2 calculated in the outer decoder at the previous stage.

Figure 9:
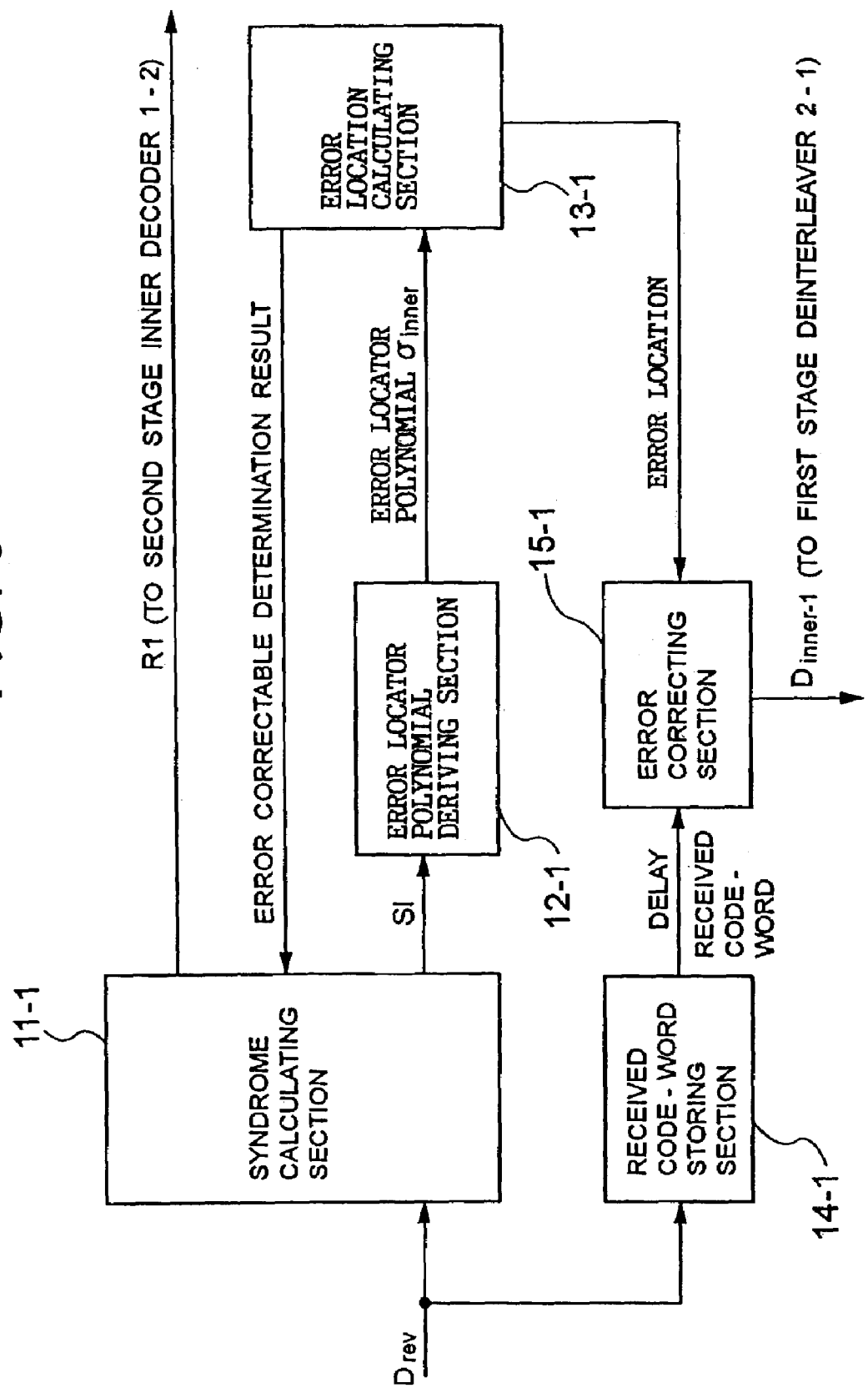
FIG. 9 is a block diagram showing a configuration of a first stage inner decoder of FIG. 8.

FIG. 9 is a block diagram showing the configuration of a first stage inner decoder 1-1 of FIG. 8. The first stage inner decoder 1-1 comprises a syndrome calculating section 11-1, an error locator polynomial deriving section 12-1, an error location calculating section 13-1, a received code-word storing section 14-1, and an error correcting section 15-1.

The syndrome calculating section 11-1 calculates the syndrome coefficients $SI_i$ (i=1, . . . , 8) on the basis of the residual polynomials $RI_j(z)$ (j=1, 3, 5, 7) defined by the expression, $$RI(z) = Y_{inner}(z) \bmod MI_j(z) \qquad (21)$$

$$= r_{j,0} + r_{j,1}z + r_{j,2}z^2 + \ldots + r_{j,5}z^5$$

The syndrome coefficients $SI_i$ are defined such as:

$SI_1 = RI_1(\alpha_{inner})$, $SI_2 = RI_1[(\alpha_{inner})^2]$, $SI_3 = RI_3[(\alpha_{inner})^3]$, $SI_4 = RI_1[(\alpha_{inner})^4]$, $SI_5 = RI_5[(\alpha_{inner})^5]$, $SI_6 = RI_3[(\alpha_{inner})^6]$, $SI_7 = RI_7[(\alpha_{inner})^7]$, $SI_8 = RI_1[(\alpha_{inner})^8]$ (22)

Where $Y_{inner}(z)$ is the received polynomial, $\alpha_{inner}$ is a primitive element in the Galois field, $MI_j(z)$ is the least polynomial of $(\alpha_{inner})^j$, and mod is the modulus. The syndrome coefficients $SI_i$ as defined by the expression (22) have the same values as the syndrome coefficients $SI_i$ as defined by the expression (13) employed in one embodiment of this invention.

Since the order of the least polynomial $MI_j(z)$ is coincident with the Galois field primitive polynomial order "6", the residual polynomial $RI_j(z)$ that is the residue of the received polynomial $Y_{inner}(z)$ divided by the least polynomial $MI_j(z)$ becomes a fifth order polynomial. The coefficients of the residual polynomial $RI_j(z)$ are zero or one, so that the residual polynomial $RI_j(z)$ is represented by 6 bits.

Since the residual polynomial $RI_j(z)$ has only 6 bits, the syndrome coefficient $SI_i$ can be simply obtained from the residual polynomial $RI_j(z)$. The calculated syndrome coefficient $SI_i$ is output to the error locator polynomial deriving section 12-1. Also, the syndrome calculating section 11-1 outputs the residual polynomial $RI_j(z)$ for the decoded data $D_{inner-1}$ by the first stage inner decoder 1-1 as the first stage inner code residual polynomial R1(z) to the second stage inner decoder 1-2.

If the errors in the received polynomial $Y_{inner}(x)$ are less than or equal to the error correctable bit number (4 bits), the errors are totally corrected, whereby zero is output as the first stage inner code residual polynomial R1(z). If the errors in the received polynomial $Y_{inner}(x)$ are more than the error correctable bit number (4 bits), the errors are not corrected, so that the encoded data $D_{rev}$ received through the transmission path is directly output as the decoded data $D_{inner-1}$, whereby the residual polynomial $RI_j(z)$ derived in the syndrome calculating section 11-1 is output as the first stage inner code residual polynomial R1(z). The error location calculating section 13-1 makes a determination whether the errors are correctable, its determination result being input into the syndrome calculating section 11-1.

The error locator polynomial deriving section 12-1, the error location calculating section 13-1, the received code-word storing section 14-1, and the error correcting section 15-1 perform the exactly same operation as those of one embodiment of the invention.

Figure 10:
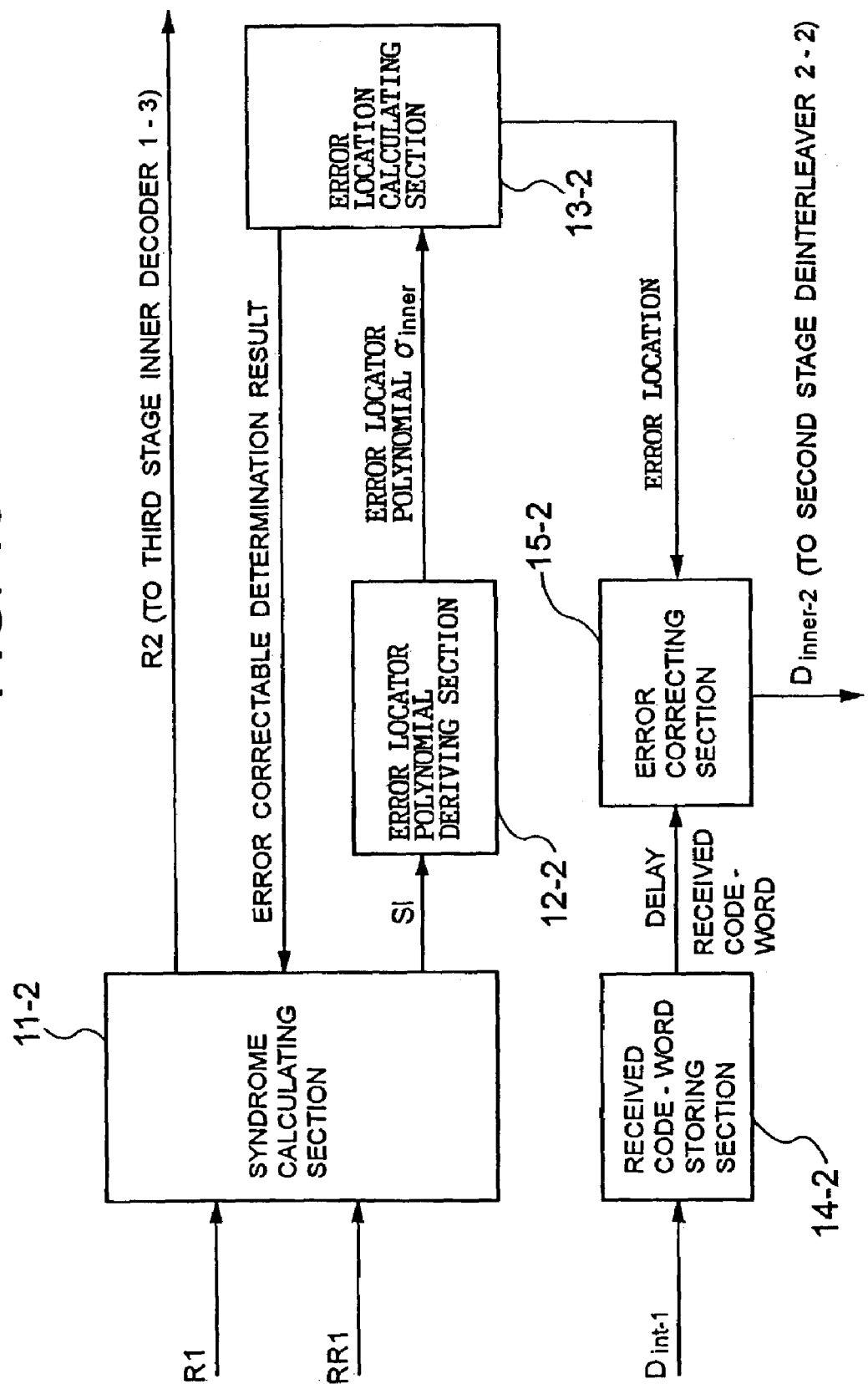
FIG. 10 is a block diagram showing a configuration of a second stage inner decoder of FIG. 8.

FIG. 10 is a block diagram showing the configuration of a second stage inner decoder 1-2 of FIG. 8. The second stage inner decoder 1-2 comprises a syndrome calculating section 11-2, an error locator polynomial deriving section 12-2, an error location calculating section 13-2, a received code-word storing section 14-2, and an error correcting section 15-2.

The error locator polynomial deriving section 12-2, the error location calculating section 13-2, the received code-word storing section 14-2, and the error correcting section 15-2 perform the exactly same operation as those of one embodiment of the invention.

The syndrome calculating section 11-2 adds the first stage inner code residual polynomial R1(z) output from the first stage inner decoder 1-1 and the first stage inner code modification residual polynomial RR1(z) output from the first stage outer decoder 3-1, and calculates the syndrome coefficients $SI_i$ (i=1, . . . , 8) from the addition results RI(z) in accordance with the expression (22). The calculated syndrome coefficients $SI_i$ are output to the error locator polynomial deriving section 12-2. Also, the syndrome calculating section 11-2 outputs zero, if the error correctable determination result is error correctable, or otherwise, outputs the addition result RI(z) as the second stage inner code residual polynomial R2(z) to the third stage inner decoder 1-3.

The third stage inner decoder 1-3 performs the same operation as the second stage inner decoder 1-2 as above. However, since the third stage inner decoder 1-3 that is at the final stage does not output the inner code residual polynomial. The first stage to third stage deinterleavers 2-1 to 2-3 and the first stage and second stage interleavers 4-1 and 4-2 perform the exactly same operation as those of one embodiment of the invention.

Figure 11:
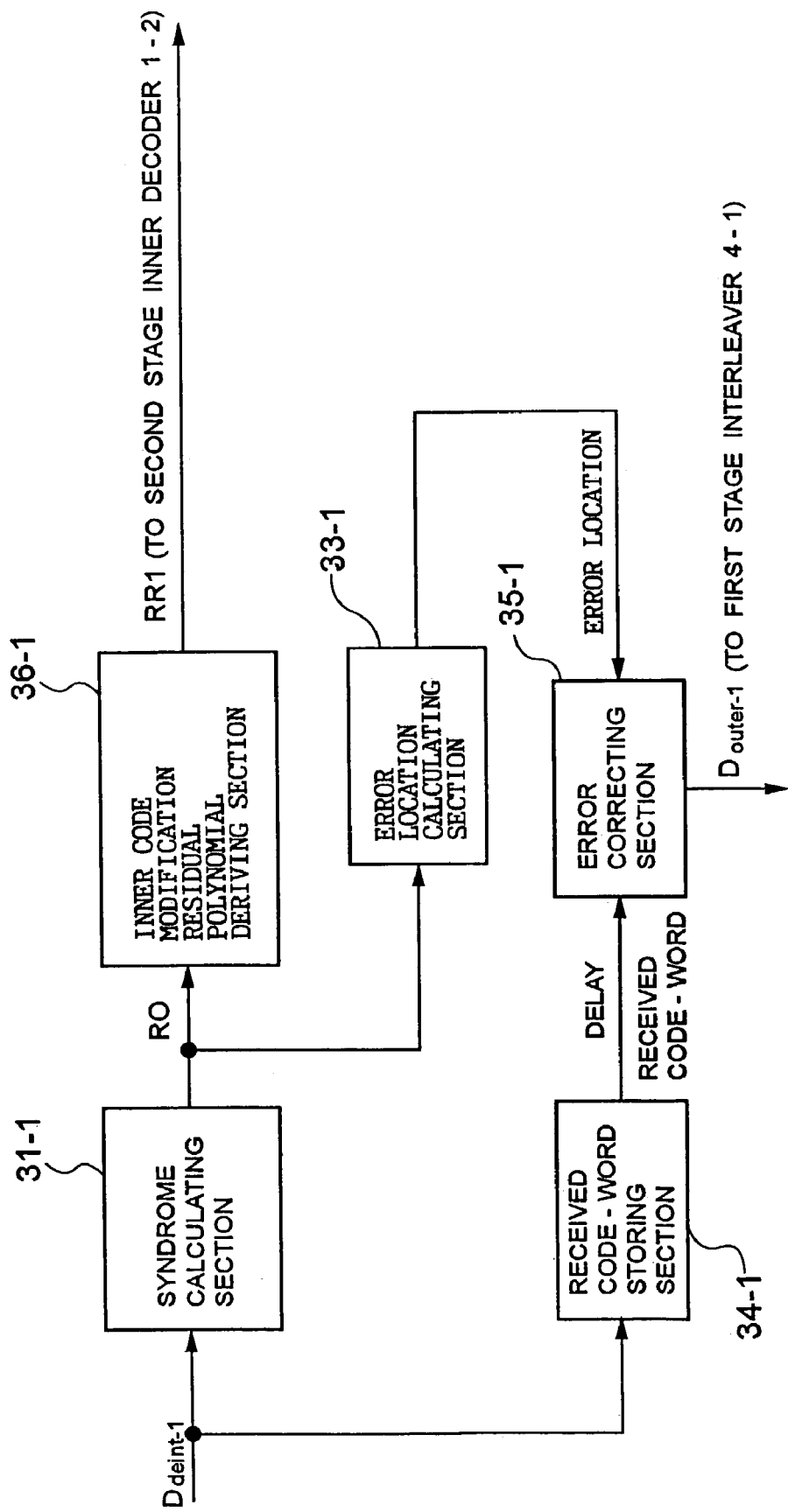
FIG. 11 is a block diagram showing a configuration of a first stage outer decoder of FIG. 8.
Figure 12:
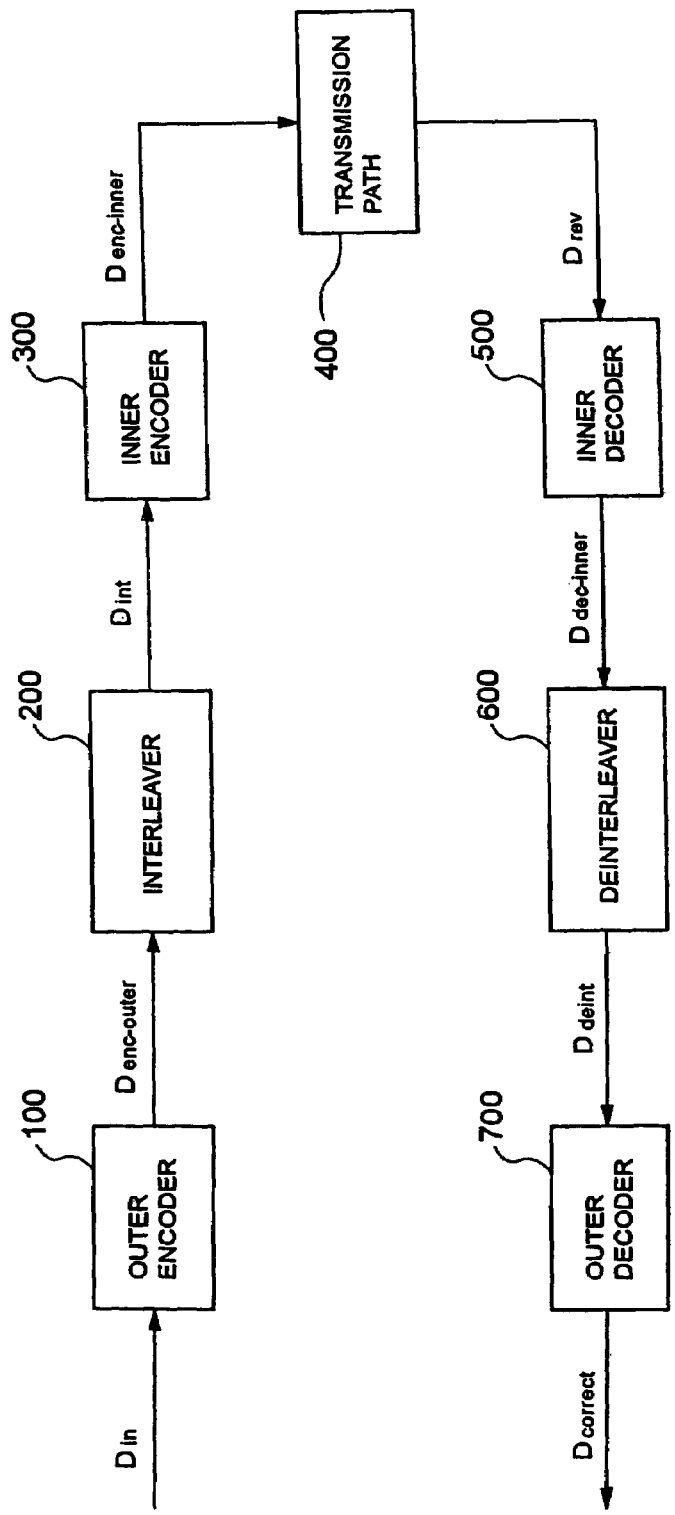
FIG. 12 is a block diagram showing a configuration of a conventional iterative concatenated BCH decoding circuit.
Figure 13:
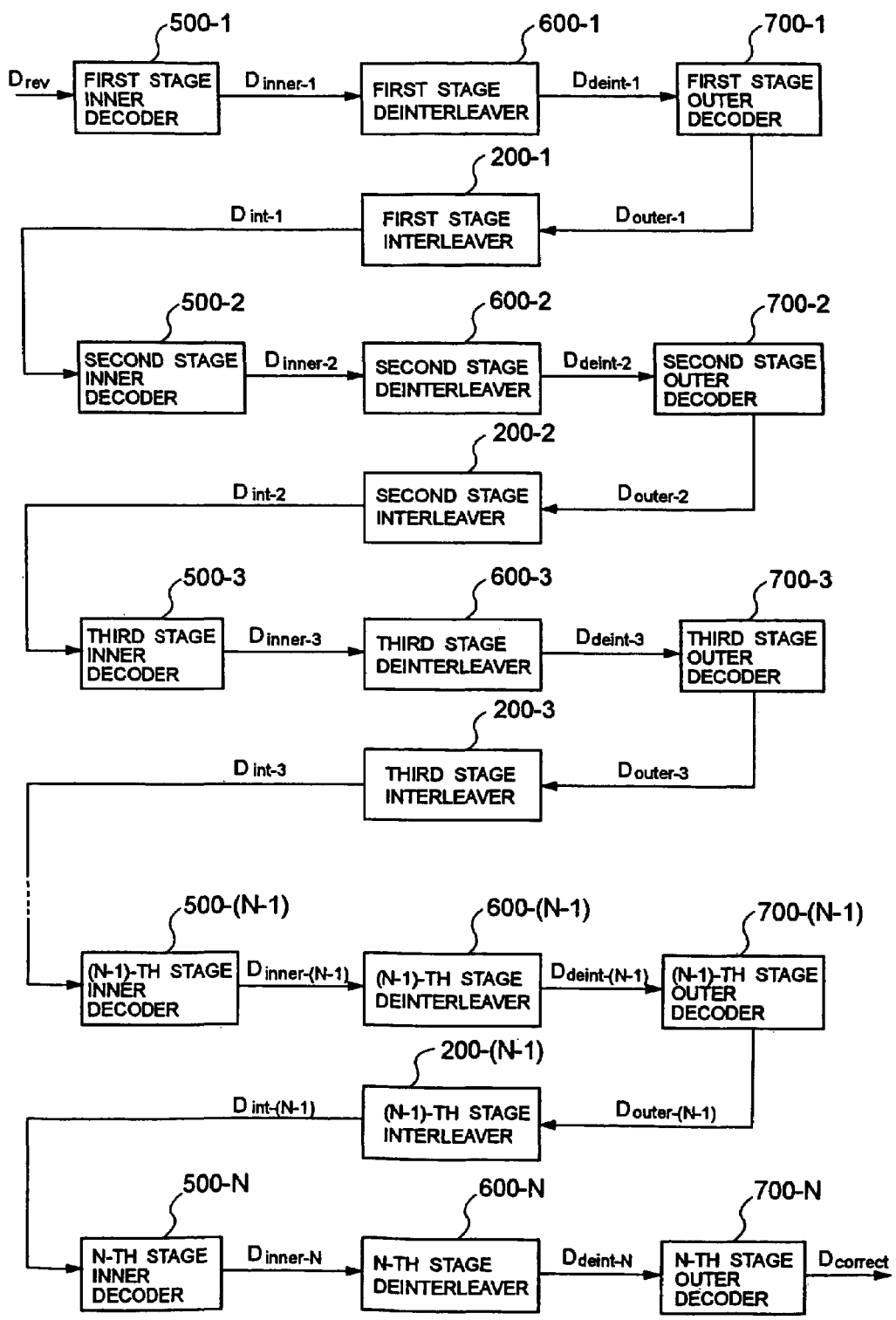
FIG. 13 is a block diagram showing a configuration of a conventional N-times iterative concatenated BCH decoding circuit.

FIG. 11 is a block diagram showing the configuration of a first stage outer decoder 3-1 of FIG. 8. The first stage outer decoder 3-1 comprises a syndrome calculating section 31-1, an error location calculating section 33-1, a received code-word storing section 34-1, an error correcting section 35-1, and an inner code modification residual polynomial deriving section 36-1.

The syndrome calculating section 31-1 in another embodiment of this invention calculates the residual polynomial RO(z) as defined by the expression, $$RO(z) = Y_{outer}(z) \bmod MO(z) \quad (23)$$

$$= r_0 + r_1 z + r_2 z^2 + \ldots + r_5 z^5$$

The syndrome coefficients $SO_i$ (i=1, 2) are defined such as:

$$SO_1 = RO(\alpha_{outer}),$$

$$SO_2 = RO[(\alpha_{outer})^2] \quad (24)$$

However, the syndrome calculating section 31-1 does not employ the syndrome coefficients $SO_i$. Where $Y_{outer}(z)$ is the received polynomial, $\alpha_{outer}$ is a primitive element in the Galois field, MO(z) is the least polynomial of $\alpha_{outer}$, and mod is the modulus.

Since the order of the least polynomial MO(z) is coincident with the Galois field primitive polynomial order "6", the residual polynomial RO(z) that is the residue of the received polynomial $Y_{outer}(z)$ divided by the least polynomial MO(z) becomes a fifth order polynomial. The coefficients of the residual polynomial RO(z) are zero or one, so that the residual polynomial RO(z) is represented by 6 bits.

The calculated residual polynomial RO(z) is output to the inner code modification residual polynomial deriving section 36-1 and the error location calculating section 33-1. The syndrome coefficients $SO_i$ are uniquely obtained from the residual polynomial RO(z). Accordingly, the error location is uniquely obtained from the residual polynomial RO(z).

The inner code modification residual polynomial deriving section 36-1 generates the inner code modification residual polynomial RR1 on the basis of the residual polynomial RO(z). The inner code modification residual polynomial is derived using the ROM. Since the outer code-word is decomposed into two inner code-words, the residual polynomial modification amount of two inner code-words corresponding to the residual polynomial RO(z) is output from the ROM, with the residual polynomial RO(z) as an input address. The ROM has an address length of 6 bits, and a word length of 48 (=2×6×4) bits. Since the inner code-word is composed of two outer code-words, the addition result of the inner code residual polynomial modification amounts by two outer code-words becomes the first stage inner code modification residual polynomial RR1. The derived first stage inner code modification residual polynomial RR1 is output to the second stage inner decoder 1-2.

The inner code modification syndrome coefficient deriving section 32-1 in one embodiment of the invention is constituted of the ROM that outputs the modification syndrome coefficients of two inner code-words of 96 bits in total, with the syndrome coefficients $SO_i$ of 12 bits in total as an input address. On the contrary, the inner code modification residual polynomial deriving section 36-1 in another embodiment of the invention is constituted of the ROM having an address length of 6 bits and a word length of 48 bits. Accordingly, the inner code modification residual polynomial deriving section 36-1 in another embodiment of the invention has a half address length, a half word length and a 1/128 area [=1/($2^6$)×½] of the ROM in contrast to the inner code modification syndrome coefficient deriving section 32-1 in one embodiment of the invention.

The error location calculating section 33-1 generates the error location on the basis of the residual polynomial RO(z). The error location is represented by 6 bits per error. Since the residual polynomial RO(z) is represented by 6 bits, the error location calculating section 33-1 can be implemented by the ROM having an address length of 6 bits and a word length of 6 bits.

The error location calculating section 33-1 in one embodiment of the invention outputs one error location of 6 bits, with the syndrome coefficients $SO_i$ of 12 bits in total as an input address. Accordingly, the error location calculating section 33-1 in another embodiment of the invention has a half address length, a half word length and a 1/64 area [=1/($2^6$)] of the ROM in contrast to the error location calculating section 33-1 in one embodiment of the invention. The received code-word storing section 34-1 and the error correcting section 35-1 perform the exactly same operation as in one embodiment of the invention.

The second stage outer decoder 3-2 also performs the same processing as the first stage outer decoder 3-1. The third stage outer decoder 3-3 also performs the same processing as the first stage outer decoder 3-1, although the inner code modification residual polynomial deriving section is not provided.

Also, the residual polynomial is employed in another embodiment of the invention, whereby the area of the ROM for use in the outer decoder can be greatly reduced as compared with one embodiment of the invention.

As above described, this invention provides an iterative concatenated code decoding circuit employing a concatenated code, an coding ratio of each of the inner code and the outer code is represented by (code-word length–redundancy check length)/(code-wordlength). The inner code having a high coding ratio and the outer code having a low coding ratio are employed, whereby there is the effect that the circuit size is reduced and the error correction capabilities are improved.

What is claimed is:

1. An iterative concatenated code decoding circuit, employing a concatenated code concatenating an outer code and an inner code, in which a coding ratio of each of said inner code and said outer code is respectively represented by (code-word length redundancy check length)/(code-word length), said inner code having a higher coding ratio than said outer code, said decoding circuit comprising:
   an inner decoder for decoding said inner code having a high coding ratio; and
   an outer decoder for decoding said outer code having a low coding ratio,
   wherein:
   said inner decoder and said outer decoder are disposed at multiple stages and said outer decoder comprises a circuit configuration different than a circuit configuration of said inner decoder to locate and correct errors,
   said concatenated code comprises a BCH (Bose-Chaudhuri-Hocciuenghem) code containing a Reed-Solomon code,
   said outer decoder employs a read-only memory to acciuire an inner code modification syndrome coefficient indicating a variation between a syndrome coefficient for output data of said inner decoder at a former stage and a syndrome coefficient for input data of said inner decoder at a latter stage when errors are corrected,
   and the inner decoders at a second and ensuing stages make the decoding on a basis of a result of adding a syndrome coefficient of the inner decoder at the former stage and said inner code modification syndrome coefficient calculated by the outer decoder at the former stage.

2. The iterative concatenated code decoding circuit according to claim 1, wherein said outer decoder employs the read-only memory to acquire an inner code modification residual polynomial indicating a variation between a residual polynomial for output data of said inner decoder at a former stage and a residual polynomial for input data of said inner decoder at a latter stage when errors are corrected, and the inner decoders at a second and ensuing stages make the decoding on a basis of a result of adding the residual polynomial of the inner decoder at the former stage and said inner code modification residual polynomial calculated by the outer decoder at the former stage.

3. An iterative concatenated code decoding circuit, employing a concatenated code concatenating an outer code and an inner code, in which a coding ratio of each of said inner code and said outer code is respectively represented by (code-word length—redundancy check length)/(code-word length), said inner code having a higher coding ratio than said outer code, said decoding circuit comprising:
   an inner decoder for decoding said inner code having a high coding ratio; and
   an outer decoder for decoding said outer code having a low coding ratio,
   wherein said inner decoder and said outer decoder are disposed at multiple stages,
   said outer decoder employs a read-only memory to detect an error location,
   said outer decoder employs the read-only memory to acQuire an inner code modification syndrome coefficient indicating a variation between a syndrome coefficient for the output data of said inner decoder at the former stage and a syndrome coefficient for the input data of said inner decoder at the latter stage when the errors are corrected, and
   the inner decoders at the second and ensuing stages make the decoding on the basis of the result of adding the syndrome coefficient of the inner decoder at the former stage and said inner code modification syndrome coefficient calculated by the outer decoder at the former stage.

4. The iterative concatenated code decoding circuit according to claim 3, wherein said outer decoder employs the read-only memory to acquire an inner code modification residual polynomial indicating a variation between a residual polynomial for output data of said inner decoder at a former stage and a residual polynomial for input data of said inner decoder at a latter stage when errors are corrected, and the inner decoders at a second and ensuing stages make the decoding on a basis of a result of adding the residual polynomial of the inner decoder at the former stage and said inner code modification residual polynomial calculated by the outer decoder at the former stage.

5. An iterative concatenated code decoding circuit, comprising:
   an inner decoder for decoding the encoded data received through a transmission path and correcting the errors of said data;
   a deinterleaver for deinterleaving the data decoded by said inner decoder;
   an outer decoder for decoding the deinterleaved data and correcting the errors of said data; and
   an interleaver for interleaving the data decoded by said outer decoder,
   wherein said inner decoder, said deinterleaver, said outer decoder and said interleaver are disposed at N (N is a positive integer) stages, said iterative concatenated code decoding circuit employs a concatenated code concatenating an outer code and an inner code, in which a coding ratio of each of said inner code and said outer code is respectively represented by (code-word length—redundancy check length)/(code-word length), said inner decoder decodes said inner code with a high coding ratio and said outer decoder decodes said outer code with a low coding ratio stages, and said outer decoder comprises a circuit configuration different than a circuit configuration of said inner decoder to locate and correct errors;
   said outer decoder employs a read-only memory to accjuire an inner code modification syndrome coefficient indicating a variation between a syndrome coefficient for output data of said inner decoder at a former stage and a syndrome coefficient for input data of said inner decoder at a latter stage when an error is corrected, and the inner decoders at a second and ensuing stages make the decoding on a basis of a result of adding the syndrome coefficient of the inner decoder at the former stage and said inner code modification syndrome coefficient calculated by the outer decoder at the former stage.

6. The iterative concatenated code decoding circuit according to claim 5, wherein said concatenated code is comprises a BCH (Bose-Chaudhuri-Hocquenghem) code containing a Reed-Solomon code.

7. The iterative concatenated code decoding circuit according to claim 6, wherein said outer decoder employs the read-only memory to acquire an inner code modification residual polynomial indicating a variation between a residual polynomial for output data of said inner decoder at a former stage and a residual polynomial for input data of said inner decoder at a latter stage when errors are corrected, and the inner decoders at a second and ensuing stages make the decoding on a basis of a result of adding the residual polynomial of the inner decoder at the former stage and said inner code modification residual polynomial calculated by the outer decoder at the former stage.

8. The iterative concatenated code decoding circuit according to claim 5, wherein said outer decoder employs said read-only memory to detect an error location.

9. The iterative concatenated code decoding circuit according to claim 8, wherein said outer decoder employs the read-only memory to acquire an inner code modification residual polynomial indicating a variation between a residual polynomial for output data of said inner decoder at a former stage and a residual polynomial for input data of said inner decoder at a latter stage when errors are corrected, and the inner decoders at a second and ensuing stages make the decoding on a basis of a result of adding the residual polynomial of the inner decoder at the former stage and said inner code.

10. The iterative concatenated code decoding circuit according to claim 5, wherein said outer decoder employs the read-only memory to acquire an inner code modification residual polynomial indicating a variation between a residual polynomial for output data of said inner decoder at a former stage and a residual polynomial for input data of said inner decoder at a latter stage when the errors are corrected, and the inner decoders at a second and ensuing stages make the decoding on a basis of a result of adding the residual polynomial of the inner decoder at the former stage and said inner code modification residual polynomial calculated by the outer decoder at the former stage.

11. An encoding/decoding system, comprising:
an encoding device for encoding a concatenated code concatenating an outer code and an inner code; and
a decoding device including an iterative concatenated code decoding circuit for decoding said concatenated code, in which a coding ratio of each of said inner code and said outer code is respectively represented by (code-word length—redundancy check length)/(code-word length),
wherein said encoding device comprises an inner encoder for encoding said inner code with a high coding ratio, and an outer encoder for encoding said outer code with a low coding ratio,
said iterative concatenated code decoding circuit comprises an inner decoder for decoding said inner code with the high coding ratio and an outer decoder for decoding said Outer code with the low coding ratio,
said inner decoder and said outer decoder are disposed at multiple stages,
said outer decoder comprises a circuit configuration different than a circuit configuration of said inner decoder to locate and correct errors,
said concatenated code comprises a BCH (Bose-Chaudhuri-Hocciuenghem) code containing a Reed-Solomon code,
said outer decoder employs a read-only memory to acQuire an inner code modification syndrome coefficient indicating a variation between a syndrome coefficient for output data of said inner decoder at a former stage and a syndrome coefficient for input data of said inner decoder at a latter stage when errors are corrected, and
the inner decoders at a second and ensuing stages make the decoding on a basis of a result of adding the syndrome coefficient of the inner decoder at the former stage and said inner code modification syndrome coefficient calculated by the outer decoder at the former stage.

12. The encoding/decoding system according to claim 11, wherein said outer decoder employs the read-only memory to acquire an inner code modification residual polynomial indicating a variation between a residual polynomial for output data of said inner decoder at a former stage and a residual polynomial for input data of said inner decoder at a latter stage when errors are corrected, and the inner decoders at a second and ensuing stages make the decoding on a basis of a result of adding the residual polynomial of the inner decoder at the former stage and said inner code modification residual polynomial calculated by the outer decoder at the former stage.

13. An encoding/decoding system, comprising:
an encoding device for encoding a concatenated code concatenating an outer code and an inner code; and
a decoding device including an iterative concatenated code decoding circuit for decoding said concatenated code, in which a coding ratio of each of said inner code and said outer code is respectively represented by (code-word length—redundancy check length)/(code-word length),
wherein said encoding device comprises an inner encoder for encoding said inner code with a high coding ratio, and an outer encoder for encoding said outer code with a low coding ratio,
said iterative concatenated code decoding circuit comprises an inner decoder for decoding said inner code with the high coding ratio and an outer decoder for decoding said outer code with the low coding ratio, said inner decoder and said outer decoder are disposed at multiple stages,
wherein said outer decoder employs a read-only memory to detect an error location,
said outer decoder employs the read-only memory to acciuire an inner code modification syndrome coefficient indicating a variation between a syndrome coefficient for output data of said inner decoder at a former stage and a syndrome coefficient for input data of said inner decoder at a latter stage when errors are corrected, and the inner decoders at a second and ensuing stages make the decoding on a basis of a result of adding the syndrome coefficient of the inner decoder at the former stage and said inner code modification syndrome coefficient calculated by the outer decoder at the former stage.

14. The encoding/decoding system according to claim 13, wherein said outer decoder employs the read-only memory to acquire an inner code modification residual polynomial indicating a variation between a residual polynomial for output data of said inner decoder at a former stage and a residual polynomial for input data of said inner decoder at a latter stage when errors are corrected, and the inner decoders at a second and ensuing stages make the decoding on a basis of a result of adding the residual polynomial of the inner decoder at the former stage and said inner code modification residual polynomial calculated by the outer decoder at the former stage.

15. An encoding/decoding system, comprising:
an encoding device for encoding a concatenated code concatenating an outer code and an inner code;
an inner decoder for decoding the encoded data received through a transmission path from said encoding device and correcting the errors of said data;
a deinterleaver for deinterleaving the decoded data;
an outer decoder for decoding the deinterleaved data and correcting the errors of said data; and
an interleaver for interleaving the data decoded by said outer decoder,
wherein said inner decoder, said deinterleaver, said outer decoder and said interleaver are disposed at N (N is a positive integer) stages,
said iterative concatenated code decoding circuit employs the concatenated code concatenating an outer code and an inner code, in which a coding ratio of each of said inner code and said outer code is respectively represented by (code-word length—redundancy check length)/(code-word length),
said encoding device has an inner encoder for encoding said inner code with a high coding ratio, and an outer encoder for encoding said outer code with a low coding ratio, and said inner decoder decodes said inner code with the high coding ratio and said outer decoder decodes said outer code with the low coding ratio, and said outer decoder comprises a circuit configuration different than a circuit configuration of said inner decoder to locate and correct errors
said outer decoder employs a read-only memory to acciuire an inner code modification syndrome coefficient indicating a variation between a syndrome coefficient for output data of said inner decoder at a former stage and a syndrome coefficient for input data of said inner decoder at a latter stage when errors are corrected, and the inner decoders at a second and ensuing stages make the decoding on a basis of a result of adding the syndrome coefficient of the inner decoder at the former stage and said inner code modification syndrome coefficient calculated by the outer decoder at the former stage.

16. The encoding/decoding system according to claim 15, wherein said concatenated code comprises a BCH (Bose-Chaudhuri-Hocquenghem) code containing a Reed-Solomon code.

17. The encoding/decoding system according to claim 15, wherein said outer decoder employs a read-only memory to detect an error location.

18. The encoding/decoding system according to claim 15, 16, or 17, wherein said outer decoder employs the read-only memory to acquire an inner code modification residual polynomial indicating a variation between a residual polynomial for output data of said inner decoder at a former stage and a residual polynomial for input data of said inner decoder at a latter stage when the errors are corrected, and the inner decoders at the a second and ensuing stages make the decoding on a basis of a result of adding the residual polynomial of the inner decoder at the former stage and said inner code modification residual polynomial calculated by the outer decoder at the former stage.

* * * * *